(12) United States Patent
Kong et al.

(10) Patent No.: US 10,992,104 B2
(45) Date of Patent: Apr. 27, 2021

(54) DUAL LAYER GRATING COUPLER

(71) Applicant: Finisar Corporation, Sunnyvale, CA (US)

(72) Inventors: Duanhua Kong, Milpitas, CA (US); Daniel Mahgerefteh, Los Angeles, CA (US); Shiyun Lin, San Diego, CA (US); Yasuhiro Matsui, Milpitas, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 48 days.

(21) Appl. No.: 16/295,923

(22) Filed: Mar. 7, 2019

(65) Prior Publication Data

US 2019/0207362 A1 Jul. 4, 2019

Related U.S. Application Data

(63) Continuation-in-part of application No. 15/384,270, filed on Dec. 19, 2016, now Pat. No. 10,243,322.

(Continued)

(51) Int. Cl.
*G02B 6/122* (2006.01)
*H01S 5/026* (2006.01)
(Continued)

(52) U.S. Cl.
CPC .............. *H01S 5/026* (2013.01); *G02B 6/122* (2013.01); *G02B 6/12004* (2013.01); *G02B 6/34* (2013.01);
(Continued)

(58) Field of Classification Search
CPC . H01S 5/026; G02B 6/12002; G02B 6/12004; G02B 6/122; G02B 6/34
See application file for complete search history.

(56) References Cited

U.S. PATENT DOCUMENTS 4,919,507 A 4/1990 Evans
5,003,550 A 3/1991 Welch
(Continued)

FOREIGN PATENT DOCUMENTS

CN 102159975 A 8/2011
CN 103430064 A 12/2013
(Continued)

OTHER PUBLICATIONS

J.H. Abeles et al., "Monolithic High-Power InGaAs/AlGaAs Grating Surface Emitting Fanned-Out Amplifier-Lasers Emitting Monochromatic High-Quality Beams," LEOS '92 Conference Proceedings, Boston, MA, USA, 1992, pp. 521-522.
(Continued)

*Primary Examiner* — Sung H Pak
*Assistant Examiner* — Hoang Q Tran
(74) *Attorney, Agent, or Firm* — Blank Rome LLP

(57) ABSTRACT

A system includes a grating coupled laser and a photonic integrated circuit (PIC). The grating coupled laser includes a first waveguide and a transmit grating coupler optically coupled to the first waveguide. The PIC includes a second waveguide and a receive grating coupler optically coupled to the second waveguide. The receive grating coupler is in optical alignment with the transmit grating coupler. The receive grating coupler includes a first grating and a second grating spaced apart from and above the first grating within the PIC.

20 Claims, 15 Drawing Sheets

Related U.S. Application Data

(60) Provisional application No. 62/641,259, filed on Mar. 9, 2018, provisional application No. 62/379,569, filed on Aug. 25, 2016, provisional application No. 62/268,907, filed on Dec. 17, 2015.

(51) Int. Cl.
*H01S 5/00* (2006.01)
*G02B 6/12* (2006.01)
*G02B 6/34* (2006.01)
*H01S 5/187* (2006.01)
*H01S 5/22* (2006.01)

(52) U.S. Cl.
CPC .......... *H01S 5/0064* (2013.01); *H01S 5/187* (2013.01); *G02B 2006/12107* (2013.01); *G02B 2006/12121* (2013.01); *H01S 5/0071* (2013.01); *H01S 5/22* (2013.01)

(56) References Cited

U.S. PATENT DOCUMENTS

| | | | |
|---|---|---|---|
| 6,118,915 A | 9/2000 | Sato | |
| 6,282,219 B1 | 8/2001 | Butler et al. | |
| 6,730,944 B1 | 5/2004 | Tandon et al. | |
| 7,194,016 B2 | 3/2007 | Bullington | |
| 7,532,784 B2 | 5/2009 | Tolshikhin | |
| 8,041,164 B2 | 10/2011 | Granestrand | |
| 8,267,583 B2 | 9/2012 | Yao et al. | |
| 8,503,841 B2 | 8/2013 | Kopp et al. | |
| 8,660,391 B1 | 2/2014 | Fish | |
| 8,837,885 B2 | 9/2014 | Seo et al. | |
| 9,031,365 B2 | 5/2015 | Park et al. | |
| 9,091,827 B2 | 7/2015 | Verslegers et al. | |
| 9,176,291 B2 | 11/2015 | Li et al. | |
| 9,405,066 B2 | 8/2016 | Mahgerefteh et al. | |
| 9,613,886 B2 | 4/2017 | Lin | |
| 9,715,064 B1 | 7/2017 | Gambino et al. | |
| 10,243,322 B2 | 3/2019 | Mahgerefteh | |
| 10,317,632 B2 | 6/2019 | Mahgerefteh | |
| 2002/0131668 A1 | 9/2002 | Marsh | |
| 2002/0176463 A1 | 11/2002 | Bullington et al. | |
| 2003/0081902 A1 | 5/2003 | Blauvelt et al. | |
| 2004/0156589 A1 | 8/2004 | Gunn | |
| 2004/0240767 A1 | 12/2004 | Kimura et al. | |
| 2005/0147355 A1 | 7/2005 | Ilchenko | |
| 2007/0279634 A1 | 12/2007 | Gruhlke et al. | |
| 2009/0003762 A1 | 1/2009 | Chiniwalla et al. | |
| 2009/0297093 A1 | 12/2009 | Webster et al. | |
| 2009/0324163 A1 | 12/2009 | Dougherty et al. | |
| 2010/0006784 A1 | 1/2010 | Mack et al. | |
| 2011/0091157 A1* | 4/2011 | Yao ................... | G02B 6/13 385/42 |
| 2012/0093456 A1 | 4/2012 | Taillaert et al. | |
| 2012/0201491 A1 | 8/2012 | Zhou | |
| 2012/0328234 A1 | 12/2012 | Lu et al. | |
| 2013/0032281 A1 | 2/2013 | Van Den Berg et al. | |
| 2013/0259077 A1 | 10/2013 | Bakir et al. | |
| 2013/0322813 A1 | 12/2013 | Grondin et al. | |
| 2014/0140655 A1 | 5/2014 | Chakravarty et al. | |
| 2014/0140659 A1 | 5/2014 | Demaray | |
| 2014/0270620 A1 | 9/2014 | Anderson et al. | |
| 2015/0063753 A1 | 3/2015 | Evans et al. | |
| 2015/0117808 A1 | 4/2015 | Chen | |
| 2015/0177459 A1 | 6/2015 | Van Campenhout et al. | |
| 2015/0205062 A1 | 7/2015 | Collins | |
| 2015/0260913 A1* | 9/2015 | Li ........................ | H01S 5/10 385/14 |
| 2015/0260994 A1 | 9/2015 | Akutsu et al. | |
| 2015/0286008 A1 | 10/2015 | Shimizu et al. | |
| 2015/0316720 A1 | 11/2015 | Yang et al. | |
| 2015/0338577 A1 | 11/2015 | Shi et al. | |
| 2016/0018601 A1 | 1/2016 | Gardes et al. | |
| 2016/0047983 A1 | 2/2016 | Collins et al. | |
| 2016/0238793 A1 | 8/2016 | Frankel et al. | |
| 2016/0246009 A1 | 8/2016 | Jiang | |
| 2016/0294155 A1 | 10/2016 | Zheng et al. | |
| 2016/0356956 A1 | 12/2016 | Davoine et al. | |
| 2017/0075063 A1 | 3/2017 | Brouckaert et al. | |
| 2017/0179680 A1 | 6/2017 | Mahgerefteh et al. | |
| 2017/0207600 A1 | 7/2017 | Klamkin et al. | |

FOREIGN PATENT DOCUMENTS

| | | |
|---|---|---|
| EP | 0389172 A2 | 9/1990 |
| EP | 0561672 A1 | 9/1993 |
| EP | 0 623 980 A2 | 11/1994 |
| EP | 2664949 A2 | 11/2013 |
| JP | 64084776 A | 3/1989 |
| JP | 02-195309 | 8/1990 |
| JP | H105 216079 A | 8/1993 |
| JP | 2000310750 A | 11/2000 |
| JP | 2003-510656 | 3/2003 |
| JP | 2003255166 A | 9/2003 |
| JP | 2003-282569 | 10/2003 |
| JP | 2005-115117 | 4/2005 |
| JP | 2006-023385 | 1/2006 |
| JP | 2006/047462 | 2/2006 |
| JP | 2007-052328 | 3/2007 |
| JP | 2011203604 A | 10/2011 |
| JP | 2013251394 A | 12/2013 |
| JP | 2014-081587 | 5/2014 |
| JP | 2014-191301 | 10/2014 |
| JP | 2015118372 A | 6/2015 |
| KR | 20130104838 A | 9/2013 |
| WO | 2001/088577 A1 | 11/2001 |
| WO | 2009/106139 A1 | 9/2009 |
| WO | 2009/106140 A1 | 9/2009 |
| WO | 2010/033435 A2 | 3/2010 |
| WO | 2012/125267 A1 | 9/2012 |
| WO | 2014/112077 | 7/2014 |
| WO | 2015063628 A1 | 5/2015 |
| WO | 2016/011002 A1 | 1/2016 |
| WO | 2017/106880 A1 | 6/2017 |

OTHER PUBLICATIONS

International Search Report and Written Opinion dated Mar. 20, 2017 in related PCT Application No. PCT/US2016/067634 (16 pages).
Shani et al., "Integrated Optic Adiabatic Devices on Silicon", IEEE Journal of Quantum Electronics, vol. 27, No. 3, Mar. 1991, pp. 556-566.
International Search Report and Written Opinion dated Jul. 12, 2019, in related PCT Application No. PCT/US2019/031181.
International Search Report and Written Opinion dated Mar. 9, 2018, in related PCT Application No. PCT/US2017/064959 (14 pages).
International Search Report and Written Opinion, as issued in connection with International Patent Application No. PCT/US2015/060224, dated May 13, 2016, 11 pgs.
International Search Report and Written Opinion, as issued in connection with International Patent Application No. PCT/US2015/060223, dated May 23, 2016, 13 pgs.
European Communication, as issued in connection with European Application No. 15801046.2, dated Jun. 23, 2017, 2 pgs.
European Communication, as issued in connection with European Application No. 15797781.0, dated Jun. 27, 2017, 2 pgs.
Korean Preliminary Rejection, as issued in connection with Korean Application No. 10-2017-7016051, dated Jul. 18, 2017, 12 pgs.
Korean Preliminary Rejection, as issued in connection with Korean Application No. 10-2017-7016051, dated Nov. 16, 2017, 6 pgs.
Korean Preliminary Rejection, as issued in connection with Korean Application No. 10-2017-7016050, dated Jun. 12, 2018, 22 pgs.
Shani et al., "Integrated Optic Adiabatic Polarization Splitter on Silicon", Applied Physics Letters, American Institute of Physics, vol. 56, No. 2, Jan. 8, 1990, pp. 120-121.

\* cited by examiner

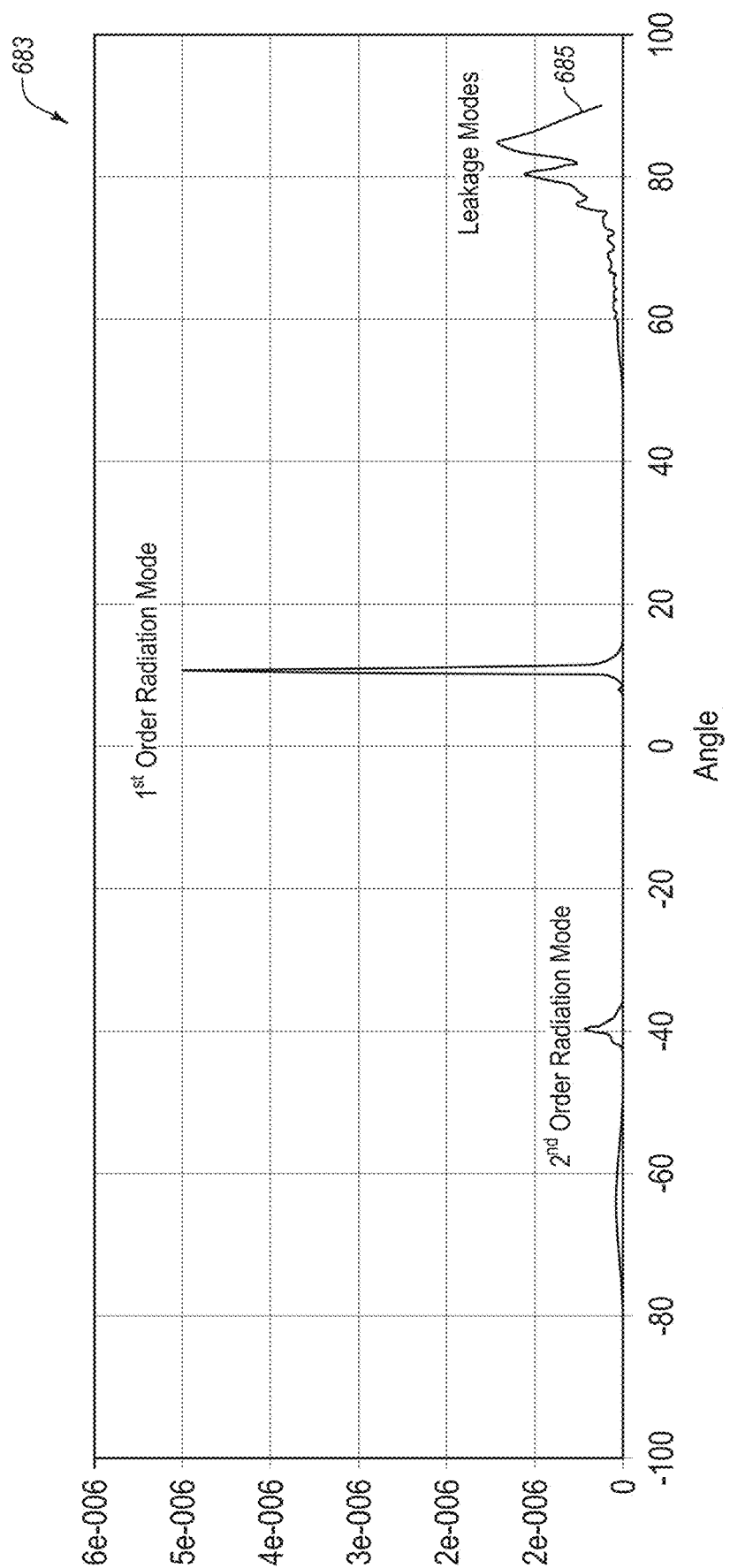

DUAL LAYER GRATING COUPLER

CROSS-REFERENCE TO RELATED APPLICATION

This patent application claims the benefit of and priority to U.S. Provisional App. No. 62/641,259 filed Mar. 9, 2018.

This application is also a continuation-in-part application of U.S. application Ser. No. 15/384,270, filed Dec. 19, 2016, which claims the benefit of and priority to U.S. Provisional App. No. 62/379,569 filed Aug. 25, 2016 and U.S. Provisional App. No. 62/268,907 filed Dec. 17, 2015.

Each of the 62/641,259 application, the 15/384,270 application, the 62/379,569 application, and the 62/268,907 application is incorporated herein by reference.

FIELD

The embodiments discussed herein are related to dual layer grating couplers.

BACKGROUND

Unless otherwise indicated herein, the materials described herein are not prior art to the claims in the present application and are not admitted to be prior art by inclusion in this section.

Coupling light from single mode edge emitting lasers to silicon (Si) photonics is costly, as it generally requires two lenses and a large isolator block. In systems that include such lasers and Si photonics, alignment tolerances may be less than 0.5 micrometers ($\mu$m). Such low alignment tolerances typically require active alignment to be met.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to dual layer grating couplers.

A system may include a grating coupled laser and a photonic integrated circuit (PIC). The grating coupled laser may include a first waveguide and a transmit grating coupler optically coupled to the first waveguide. The PIC may include a second waveguide and a receive grating coupler optically coupled to the second waveguide. The receive grating coupler may be in optical alignment with the transmit grating coupler. The receive grating coupler may include a first grating and a second grating spaced apart from and above the first grating within the PIC.

Another system may include a grating coupled laser and a PIC. The grating coupled laser may include an active section and a passive section. The active section may include a laser cavity. The passive section may include a first waveguide and a transmit grating coupler. The first waveguide may be optically coupled end to end with the laser cavity. The PIC may include a second waveguide and a receive grating coupler optically coupled to the second waveguide. The receive grating coupler may be in optical alignment with the transmit grating coupler. The receive grating coupler may include a first grating formed in a first layer of the PIC, a second grating formed in a second layer of the PIC, and a gate oxide layer formed between the first layer and the second layer of the PIC.

Another system may include a grating coupled laser and a PIC. The grating coupled laser may include an active section and a passive section. The active section may include a laser cavity. The passive section may include a first waveguide and a transmit grating coupler. The first waveguide may be optically coupled end to end with the laser cavity. The PIC may include a silicon substrate, a silicon dioxide box layer, a silicon layer, a gate oxide layer, and a silicon nitride layer. The silicon dioxide box layer may be formed above the silicon substrate. The silicon layer may be formed above the silicon dioxide box layer. A silicon grating may be formed in the silicon layer. The gate oxide layer may be formed above the silicon layer. The silicon nitride layer may be formed above the gate oxide layer. A silicon nitride grating may be formed in the silicon nitride layer. A second waveguide may be formed in the silicon nitride layer that is optically coupled to the silicon grating and the silicon nitride grating. The silicon grating and the silicon nitride grating may form a receive grating coupler. The receive grating coupler may be positioned to couple light received from the transmit grating coupler into the second waveguide.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 6A illustrates a graphical representation of an example far field profile as a function of diffraction angle for a passive section of a grating coupled laser;

DETAILED DESCRIPTION OF SOME EXAMPLE EMBODIMENTS

Figure 1A:
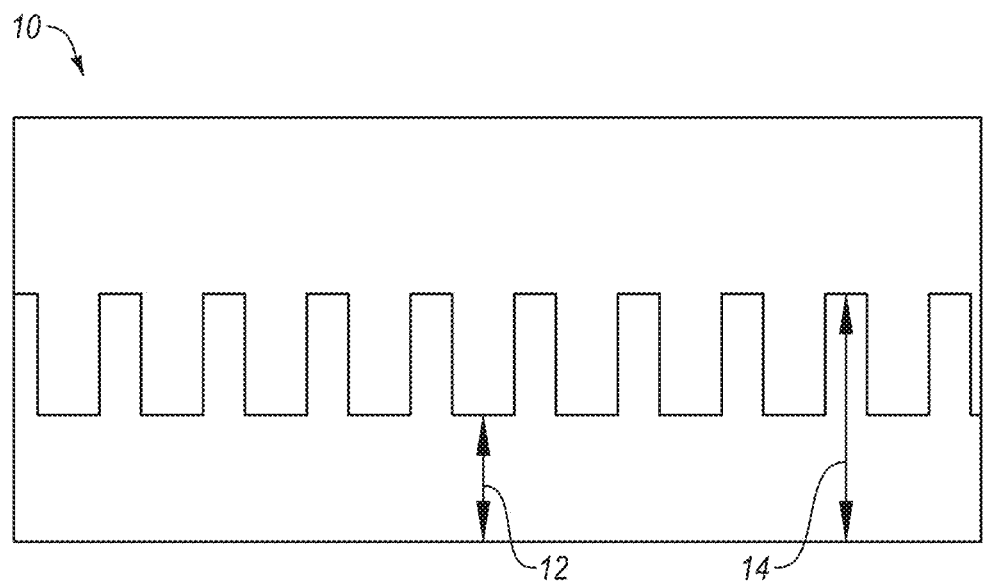
FIG. 1A illustrates an example grating coupler.

Some embodiments described herein remove the need for lenses in systems such as those described in the BACKGROUND, which may reduce part count and cost, and significantly simplify packaging processes in such systems. An isolator may be used in some embodiments of such systems, or an isolator may be omitted from some embodiments of such systems. The absence of lenses in such systems may significantly reduce the size and cost of the isolator (when included) and may significantly increase alignment tolerances. For example, the alignment tolerance may be increased by a factor of 10 or even 50 or more from about 0.1 µm which has to be done by active feed-back alignment, which requires turning on the laser during alignment, to about 1-2 µm or even 5-8 µm or more achieved in a passive alignment pick-and place machine; i.e. without having to turn on the laser. Alternatively or additionally, embodiments described herein may enable wafer level testing of lasers.

According to some embodiments, a surface coupled system may include a transmit grating coupler and a receive grating coupler. The grating couplers may couple light from an edge emitting laser to a PIC, such as a Si PIC. In some embodiments, the transmit and receive grating couplers may each include a small index contrast long surface grating. In general, a small index contrast long surface grating may include a surface grating with an index contrast less than about 1-1.5 and a length greater than 10 µm. In some embodiments, the transmit and receive grating couplers may each include a larger area surface grating (LASG) with a length greater than about 10 µm and with or without small index contrast.

The edge emitting laser may include an indium phosphide (InP) laser or other suitable edge emitting laser. The InP laser may include an input passive waveguide, also referred to as a first waveguide, that expands in a fan out region to the transmit grating coupler. The transmit grating coupler may be configured to generate a relatively large optical mode spot size of about 8-40 µm for an optical beam diffracted by the transmit grating coupler. Such an edge emitting laser formed in the same chip with a transmit grating may be referred to herein as a grating coupled laser. As used herein, "transmit grating coupler" may generally refer to one or more diffraction gratings included in a passive section of a grating coupled laser which diffracts light from a laser cavity of the grating coupled laser downward through a substrate and/or other layers towards the Si PIC.

The first waveguide of the grating coupled laser may include a core with a core index of refraction, a top cladding with a top cladding index of refraction, and a substrate as a bottom cladding with a bottom cladding index of refraction. The transmit grating coupler may include grating teeth formed on the core of the first waveguide, the grating teeth may each have a total height, a height above the core of the first waveguide, a period, and a duty cycle. In some embodiments, the core index of refraction may be greater than a first threshold value so that an effective index of the first diffraction grating is sufficiently higher than the bottom cladding index to avoid leakage of a diffracted optical mode into the substrate.

The receive grating coupler may be formed in the Si PIC. The receive grating coupler may be configured to receive the optical beam diffracted by the transmit grating coupler and to redirect the optical beam into a waveguide of the Si PIC, which waveguide may be referred to as a second waveguide to distinguish it from the first waveguide of the grating coupled laser. As used herein, "receive grating coupler" may generally refer to one or more diffraction gratings included in the Si PIC which receives the light from the transmit grating coupler and directs it into the second waveguide in the Si PIC.

According to some embodiments described herein, the receive grating coupler may include a dual layer grating coupler. In particular, the receive grating coupler may include a first grating and a second grating. The first grating may include, e.g., a Si grating, while the second grating may include, e.g., a silicon nitride (SiN) grating. The first grating and the second grating may be spaced apart from each other. For example, the first grating and the second grating may be separated from each other by a gate oxide layer, such as a layer of silicon dioxide ($SiO_2$), formed between the first grating and the second grating.

In an embodiment, the second grating, which may include a SiN grating, may increase a grating bandwidth of the receive grating coupler. Alternatively or additionally, the first grating, which may include a Si grating, may be located beneath the second grating and may act as both a reflector and a coupler to reduce light leakage into a substrate of an Si PIC in which the receive grating coupler is formed.

In an embodiment, the receive grating coupler may have a relatively large optical mode size of about 30 µm. More generally, the optical mode size of the receive grating coupler may be in a range from 20 µm to 40 µm, or even less than 20 µm or more than 40 µm.

In an embodiment, the optical mode of the receive grating coupler may match or substantially match the optical mode of the light received from the grating coupled laser. For example, the optical mode of the receive grating coupler may overlap the optical mode of the light received from the grating coupled laser by at least 50%.

In an embodiment, the receive grating coupler may have a coupling efficiency of 0.5 to 3 decibels (dB) for incident light from the grating coupled laser. Alternatively or additionally, the incident light from the grating coupled laser may have a Gaussian mode with an optical mode size of about 30 µm. More generally, the optical mode size of the incident light from the grating coupled laser may be in a range from 20 µm to 40 µm, or even less than 20 µm or more than 40 µm.

In an embodiment, the receive grating coupler may have low back reflection. The back reflection of the receive grating coupler may be sufficiently low that an isolator can be omitted between the grating coupled laser and the Si PIC.

Either or both of the first and second gratings of the receive grating coupler may be a uniform grating and/or an apodized grating. Alternatively or additionally, either or both of the first and second gratings may be at least one of a positive angle grating, a negative angle grating, a straight grating (e.g., a grating with straight grating lines), a curved grating (e.g., a grating with curved grating lines), an angled grating, and/or non-angled grating.

The dual layer grating coupler is generally described herein as being a receive grating coupler to couple light into a Si PIC. Alternatively, such a dual layer grating coupler may be implemented as a transmit grating coupler to couple light out of the Si PIC.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Partial etch slab thickness and total tooth height are depicted in FIG. 1A, which illustrates an example grating coupler 10, arranged in accordance with at least one embodiment described herein. The grating coupler 10 may be implemented as a transmit grating coupler or a receive grating coupler. The partial etch slab thickness is depicted in FIG. 1A at 12. The total tooth height is depicted in FIG. 1A at 14.

Figure 1B:
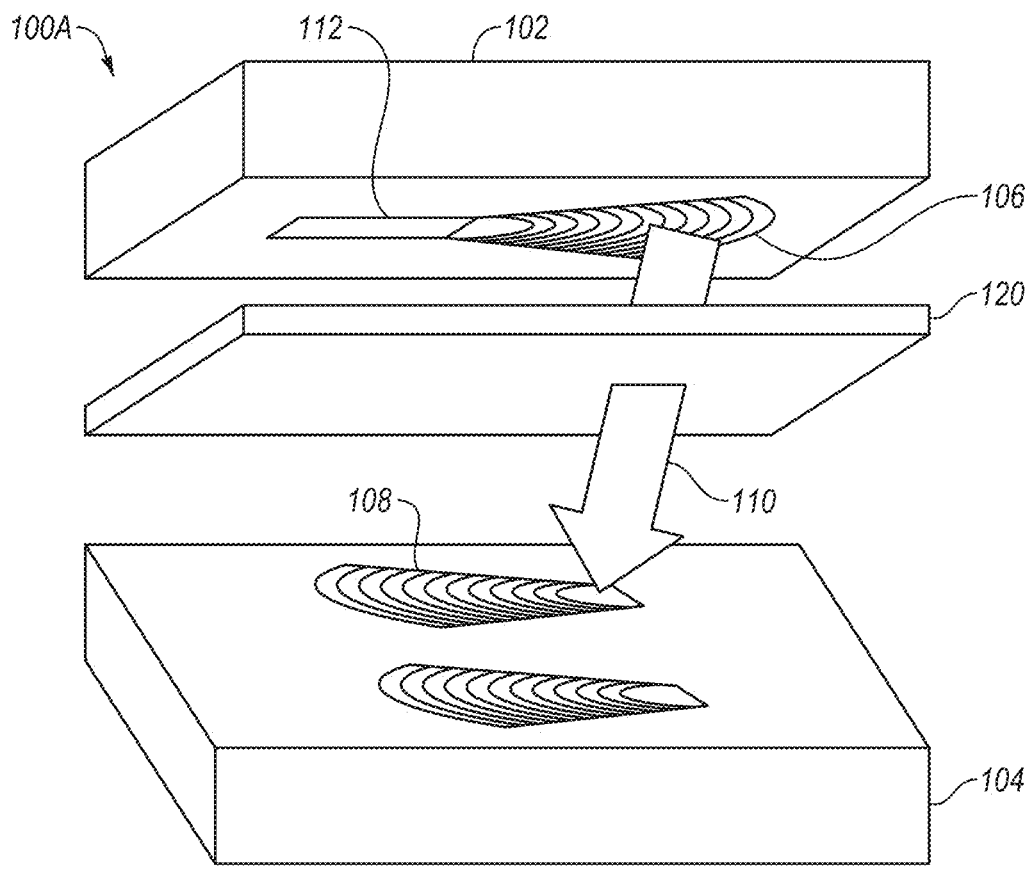
FIGS. 1B and 1C illustrate example surface coupled systems.
Figure 1C:
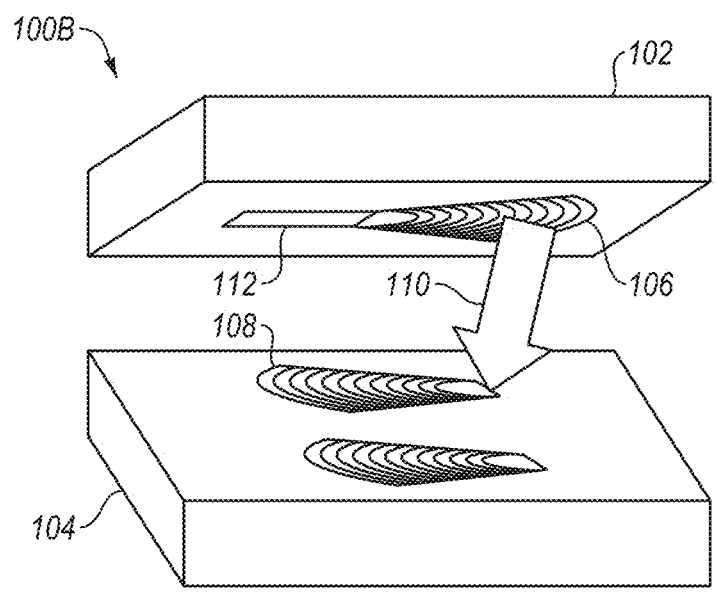

FIGS. 1B and 1C illustrate example surface coupled systems 100A and 100B (collectively "systems 100"), arranged in accordance with at least one embodiment described herein. As illustrated, the surface coupled systems 100 may each include a grating coupled laser (GCL or "GCL laser") 102 and a PIC 104. In FIGS. 1B and 1C, the GCL laser 102 may include an InP laser and the PIC 104 may include a Si PIC. The surface coupled system 100A of FIG. 1B may additionally include an optical isolator 120 (hereinafter "isolator 120") disposed between the GCL laser 102 and the Si PIC 104. In other embodiments, the isolator 120 may be omitted; for example, the surface coupled system 100B of FIG. 1C omits the isolator 120.

The GCL laser 102 may include a transmit grating coupler 106 and the PIC 104 may include a receive grating coupler 108. The transmit grating coupler 106 may be optically coupled to an active section 112 of the GCL laser 102 through a core waveguide. The core waveguide may be optically coupled to receive light emitted by a gain medium of the active section 112 of the GCL laser 102. In some embodiments, a fan out region may be provided between the core waveguide and the transmit grating coupler 106 and/or may include the core waveguide. The fan out region may be formed from a same medium and layer as the core waveguide such that the fan out region may generally be an extension of the core waveguide. Some or all of the fan out region may include grating lines such that the fan out region may generally be an extension of the transmit grating coupler 106.

The light emitted from the active section 112 of the GCL laser 102 may travel through the core waveguide to the fan out region, where a mode of the light may be expanded laterally (e.g., generally in and out of the page in FIGS. 1B and 1C). The transmit grating coupler 106 may diffract the light with the laterally expanded mode generally downward as diffracted light 110. The diffracted light 110 may be diffracted toward the receive grating coupler 108 of the PIC 104. The mode of the diffracted light 110 may be expanded to a 8-40 µm spot size (lateral measurement) within the fan out region while simultaneously being expanded along the direction of the active section 112 by the transmit grating coupler 106. One potential benefit of this method of expanding diffracted light may be that the spot size may be much larger than the 2 to 4 µm spot size that can be achieved with standard spot size converters.

The diffracted light 110 may be received by the receive grating coupler 108. The diffracted light 110 may be redirected by the receive grating coupler 108 into a waveguide (not illustrated) of the PIC 104. The waveguide of the PIC 104 may include a Si waveguide, a SiN waveguide, or other suitable waveguide.

In the surface coupled system 100A of FIG. 1B, the diffracted light 110 passes through the optical isolator 120 before reaching the receive grating coupler 108 of the PIC 104. The optical isolator 120 may be configured to reduce or eliminate back reflection. The optical isolator 120 may be attached to the PIC 104, or to the GCL laser 102, or to both the PIC 104 and the GCL laser 102, or to some other component(s).

In the surface coupled system 100B of FIG. 1C, there is not optical isolator and the diffracted light 110 passes directly to the receive grating coupler 108 of the PIC 104.

One or both of the transmit grating coupler 106 and the receive grating coupler 108 may be implemented in the same or similar manner as the grating coupler 10 of FIG. 1A.

Figure 2A:
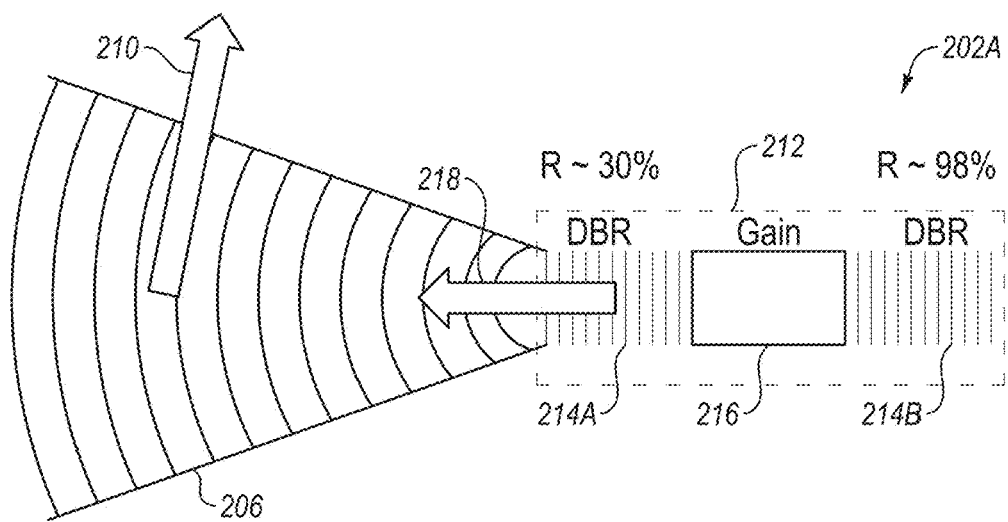
FIGS. 2A and 2B illustrate an example grating coupled laser that may be implemented in a surface coupled system.
Figure 2B:
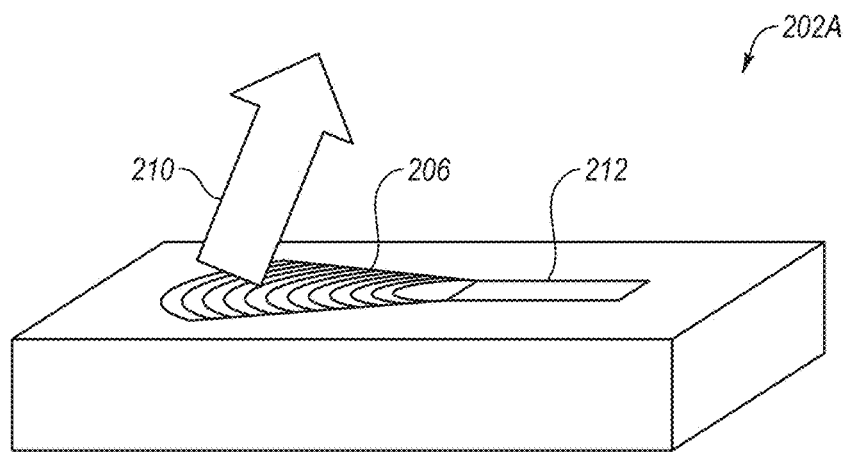
Figure 2C:
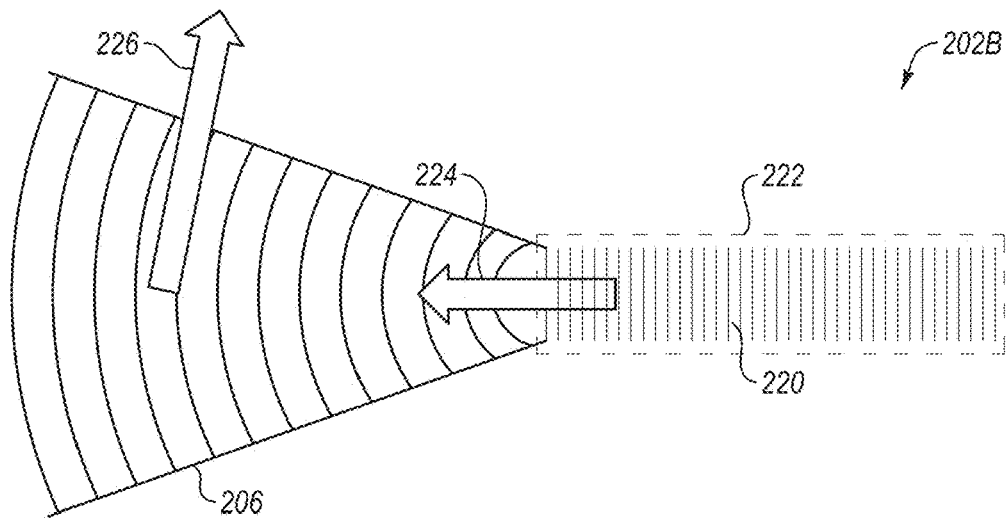
FIG. 2C illustrates another example grating coupled laser that may be implemented in a surface coupled system.

FIGS. 2A and 2B illustrate an example GCL laser 202A that may be implemented in a surface coupled system, such as the systems 100 discussed in relation to FIGS. 1B and 1C and/or in other surface coupled system described herein. FIG. 2A includes a bottom view and FIG. 2B includes a bottom perspective view of the GCL laser 202A. FIG. 2C illustrates another example GCL laser 202B that may be implemented in a surface coupled system, such as the systems 100 discussed in relation to FIGS. 1B and 1C and/or in other surface coupled systems described herein. Each of the GCL lasers 202A and 202B may include or correspond to the GCL laser 102 of FIGS. 1B and 1C or to other GCL lasers in other systems described herein.

Referring first to FIGS. 2A and 2B, the GCL laser 202A may include a gain medium 216, a first or front distributed Bragg reflector (DBR) 214A, and a second or rear DBR 214B. The first DBR 214A and the second DBR 214B together with the gain medium 216 may form a laser cavity 212 such that the GCL laser 202A in the example of FIGS. 2A and 2B may include a DBR laser. Alternatively or additionally, and as illustrated in FIG. 2C, the GCL laser 202B may include a distributed feedback (DFB) laser in which a grating 220 and gain medium 222 overlap in the laser cavity. In other embodiments, a DFB type gain region (as in FIG. 2C) and one or more passive DBR regions (as in FIG. 2A) may both be present to provide feedback in a configuration which may be termed a Distributed Reflector (DR) laser, and which may be used for high speed laser applications. Each of the GCL lasers 202A, 202B may include a transmit grating coupler 206 optically coupled to the corresponding laser cavity (e.g., 212 in FIGS. 2A and 2B). The transmit grating coupler 206 may be similar or identical to the transmit grating coupler 106 discussed in relation to FIG. 1 or to other transmit grating couplers discussed herein. A fan out region of the transmit grating coupler 206 may include grating lines such that the transmit grating coupler 206 and the fan out region partially or completely overlap.

In FIGS. 2A and 2B, a reflectance of the second DBR 214B may be about 98 percent and a reflectance of the first DBR 214A may be about 30 percent. In other embodiments, the first DBR 214A and the second DBR 214B may have other reflectance values.

In FIGS. 2A and 2B, the GCL laser 202A may generally emit light 218 through the first DBR 214A toward the transmit grating coupler 206. The emitted light 218 may interact with the transmit grating coupler 206 to be diffracted by the transmit grating coupler 206 as diffracted light 210.

In FIG. 2C, the GCL laser 202B implemented as a DFB laser may generally emit light 224 through a front (e.g., a cleaved facet with an AR coating) of the DFB laser toward the transmit grating coupler 206. The light 224 may interact with the transmit grating coupler 206 to be diffracted by the transmit grating coupler 206 as diffracted light 226.

The GCL laser 202A and/or 202B may be hermetically sealed by a passivation layer formed by SiN or silicon oxide ($SiO_x$) deposition on the GCL laser 202A or 202B. For example, one or more layers of SiN and/or $SiO_x$ may be deposited over the GCL laser 202A or 202B to hermetically seal the GCL laser 202A or 202B.

Grating couplers, such as the grating coupler 10 of FIG. 1A and the transmit grating couplers 106, 206 and the receive grating coupler 108 of FIGS. 1B-2C may have a variety of parameters, some of which will now be discussed. In general, grating couplers may include a periodic structure in which, e.g., index of refraction periodically alternates by providing repeated alternating regions, some of which have a first index of refraction and others of which have a second index of refraction. A difference between the first index of refraction and the second index of refraction may be referred to as index contrast $\Delta n$ of the grating coupler. A length of the periodic structure in a light propagation direction may be referred to as a length L of the grating coupler. Kappa, or K, may describe a depth of the grating coupler or of a corrugation included in the periodic structure, where depth is measured in a direction that is both orthogonal to the light propagation direction and orthogonal to the lateral expansion direction.

Si grating couplers such as may be implemented as the receive grating coupler 108 in FIG. 1B may have an index contrast $\Delta n$ of about 2 and a length L of 10-20 µm designed for far field emission into about a 10 µm fiber mode over about a 30 nanometer (nm) bandwidth. An InP grating coupler such as may be formed as the transmit grating couplers 106, 206 in the GCL lasers 102, 202A, 202B of FIGS. 1B-2C may have an index contrast $\Delta n$ of about 1.5-2 with a length L of about 30-50 µm to achieve >90% coupling efficiency. The length L of the InP grating coupler may be much longer than the length L of the Si grating coupler in this example to generate a relatively large spot size of 20-30 µm. In other embodiments, the length L of the InP grating coupler and of the Si grating coupler may be the same or about the same. In some embodiments, the bandwidth of the InP grating coupler may only need to be a minimum of about 4 nm if centered on a nominal center wavelength of the corresponding GCL laser to allow for difference in temperature of a DFB grating included in the GCL laser and that of the InP grating coupler. As temperature increases, an effective index of InGaAsP/InP gain material changes and shifts the DFB grating to longer wavelength. Thus, the InP grating coupler may be at nearly the same temperature as the gain material and therefore may move in the same direction and by nearly the same amount.

The Si grating coupler may be designed to match a mode profile generated by the InP grating coupler. Alternatively, the PIC may include a SiN grating coupler implemented as the receive grating coupler. SiN grating couplers may have smaller index contrast $\Delta n$ than Si grating couplers. As such, a mode profile of such a SiN grating coupler may better match the mode profile of the InP grating coupler. Alternatively, the PIC may include a dual-layer grating coupler as described elsewhere herein.

The coupling efficiency for a Si grating coupler with an index contrast $\Delta n$ about equal to 2 and a length L between 10-20 µm may be between 0.8 to 2 decibels (dB). A Si grating coupler with a smaller index contrast $\Delta n$ and/or a longer length L may have better coupling efficiency than 0.8 to 2 dB. In some embodiments, the length L of the Si grating coupler (or other receive grating coupler) may be extended to match or substantially match the length L of the InP grating coupler (or other transmit grating coupler).

In some embodiments, the periodic structure of one or more of the grating couplers described herein may include corrugations or teeth. The corrugations or teeth may be partially etched to improve directionality of light diffracted by the grating coupler.

Figure 3:
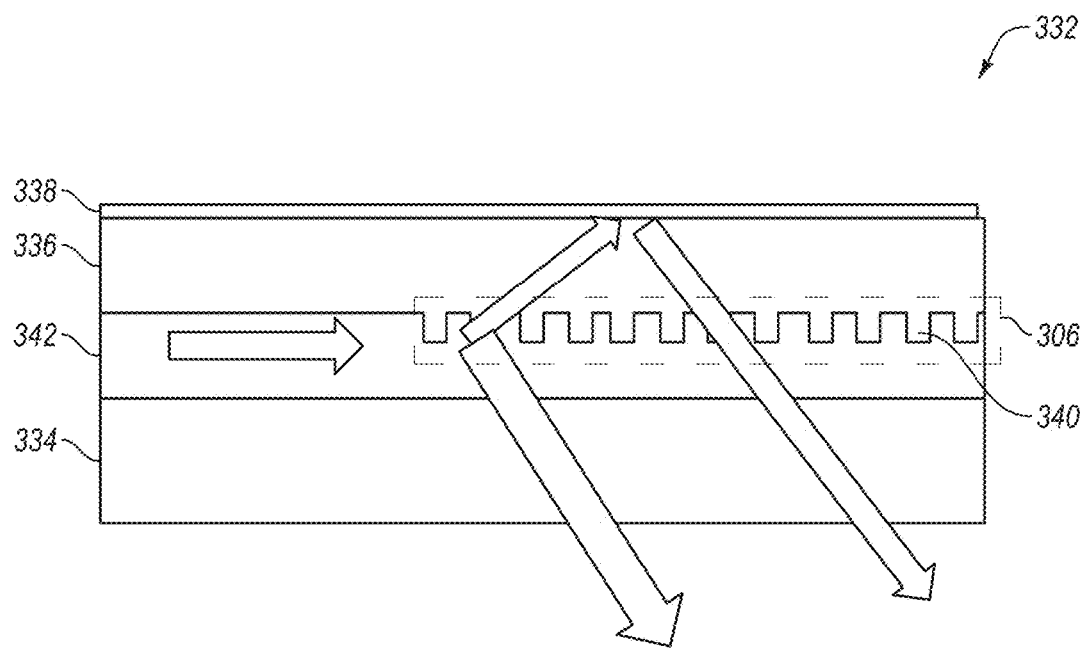
FIG. 3 illustrates a passive section of an example grating coupled laser.

FIG. 3 illustrates a passive section 332 of an example GCL laser, arranged in accordance with at least one embodiment described herein. The GCL laser that includes the passive section 332 of FIG. 3 may be implemented in one or more of the surface coupled systems discussed herein. The passive section 332 may include a core waveguide 342 optically coupled to a transmit grating coupler 306, which may correspond to or include the transmit grating couplers discussed elsewhere herein. The passive section 332 may also include a substrate 334 beneath the core waveguide 342 and the transmit grating coupler 306, a dielectric 336 above the core waveguide 342 and the transmit grating coupler 306, and a top mirror 338 above the dielectric 336. The substrate 334 may serve as cladding to the core waveguide 342. In at least one embodiment, the core waveguide 342 may include an InGaAsP waveguide. Some embodiments of a GCL laser may include a top mirror such as the top mirror 338 while other embodiments may omit the top mirror.

The transmit grating coupler 306 may include a periodic structure 340 formed at an interface between the core waveguide 342 and the dielectric 336. The periodic structure 340 may include a corrugated region that includes regions of core waveguide 342 that alternates with regions of dielectric 336. The regions of core waveguide 342 may have an index of refraction that is different than an index of refraction for the regions of dielectric 336. The periodic regions may be called corrugations or teeth. The extent of each corrugation or tooth laterally (e.g., in and out of the page) may be referred to as a grating line. The periodic structure 340 may expand laterally (e.g., in and out of the page) in the light propagation direction (e.g., from left to right), e.g., in the form of a fan out region.

The dielectric 336 may include SiO2, or SiNx or other suitable dielectric passivation materials. The top mirror 338 may include gold, a dielectric stack (e.g., HR coating), or other suitable material and/or mirror. The substrate 334 may include InP or other suitable cladding material.

Although not illustrated in FIG. 3, a GCL laser that includes the passive section 332 may additionally include an active section that includes a gain medium and one or more DBR mirrors or DFB reflectors that collectively form a laser cavity optically coupled to the core waveguide 342.

The passive section 332 may be configured to maximize a fraction of light diffracted by the transmit grating coupler 306 downward through the substrate 334. Additionally, the passive section 332 may be configured to maximize a fraction of diffracted light by the transmit grating coupler 306 through the substrate of the GCL laser and out to a receive grating coupler of a Si PIC positioned beneath the GCL laser. A fraction of a light beam travelling through the transmit grating coupler 306 may diffract away from the substrate 334 towards the epitaxially grown top surface of the passive section 332, thereby decreasing a coupling efficiency in a direction towards the substrate 334 and into a Si PIC. As such, the top mirror 338 may be deposited on the dielectric 336 to redirect upward diffracted light beams downward through the cladding 334 and into a Si PIC. To ensure the redirected light adds in phase with the light diffracted towards the cladding 334 from the transmit grating coupler 306, a thickness of the dielectric 336 may satisfy equation 4:

$$d = m(\lambda \cos(\theta))/2n_{dielectric},\qquad \text{Equation 4}$$

In equation 4, m is an integer, n is an index of refraction of the dielectric 336, θ is an angle between normal and the propagation direction of the upward diffracted light, and λ is the wavelength of the light beam.

Figure 5A:
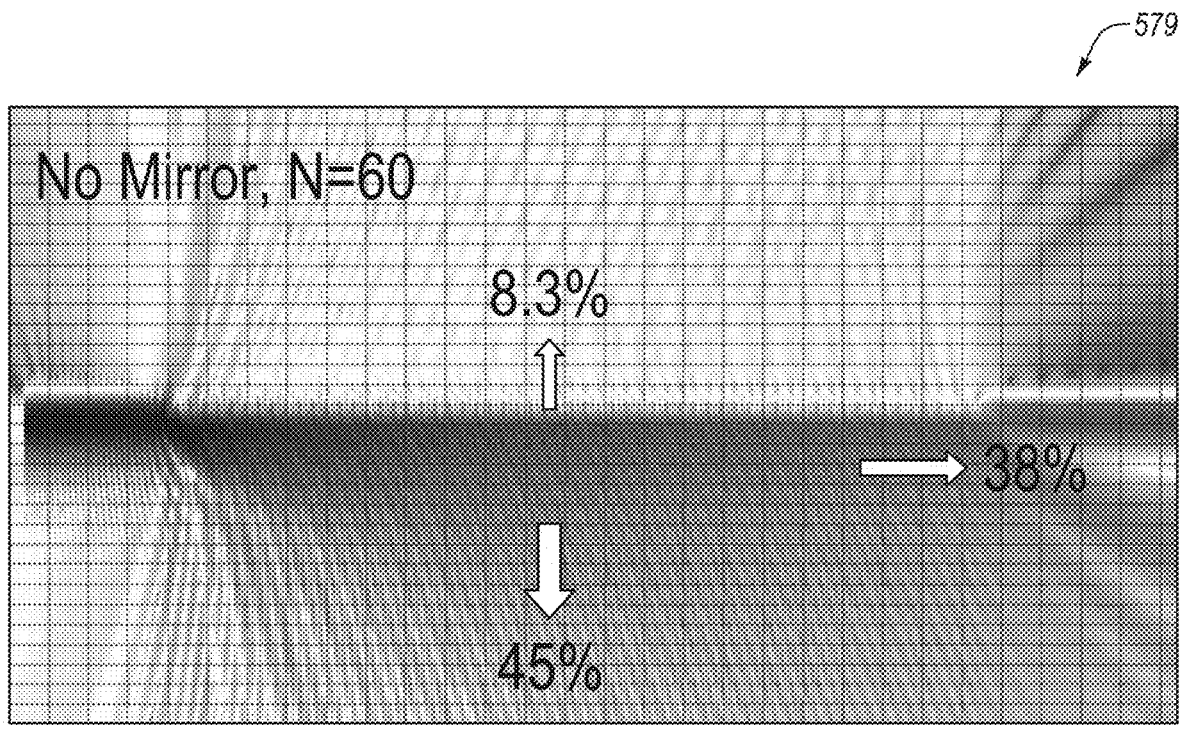
FIGS. 5A and 5B each include a graphical representation of a simulation of light propagation through a passive section of a grating coupled laser.

FIG. 5A is a graphical representation 579 of a simulation of light propagation through a passive section, arranged in accordance with at least one embodiment described herein. The passive section of FIG. 5A may be similar to the passive section 332 discussed in relation to FIG. 3 but without a top mirror (e.g., without the top mirror 338). The passive section may also have a short length (e.g., a length less than 30 μm). The passive section may include a transmit grating coupler with a grating period of 462.2 nm. Additionally, the transmit grating coupler may have 60 periods, and a length of 27.7 μm (60 periods×0.462 μm=27.7 μm). As can be seen in the graphical representation 579 of FIG. 5A, a significant portion of light (e.g., 8.3% in the example of FIG. 5A) may be lost out of the passive section due to the absence of the top mirror.

Figure 5B:
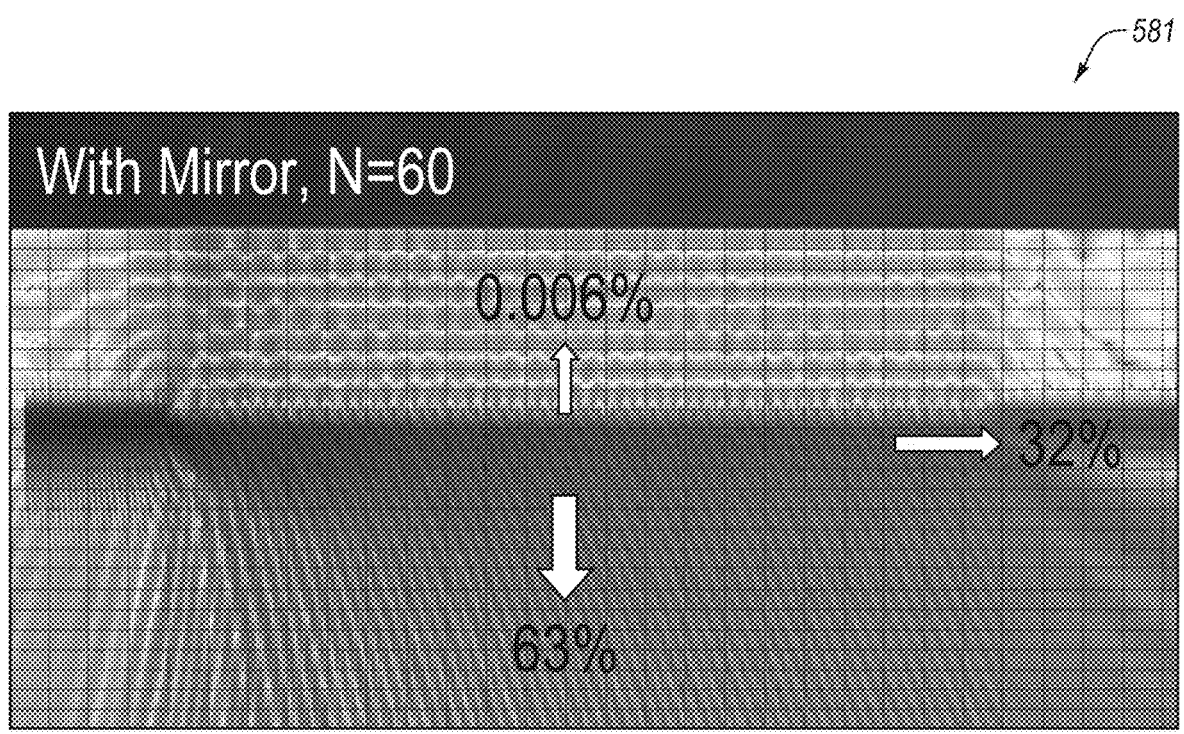

FIG. 5B is a graphical representation 581 of a simulation of light propagation through a passive section, arranged in accordance with at least one embodiment described herein. The passive section of FIG. 5B may be similar to the passive section 332 discussed in relation to FIG. 3 and may include a top mirror, such as the top mirror 338 discussed in relation to FIG. 3 above. The passive section may also have a short length (e.g., a length less than 30 μm). The passive section may include a transmit grating coupler with a grating period of 462.2 nm. Additionally, the transmit grating coupler may have 60 periods, and a length of 27.7 μm (60 periods×0.462 μm=27.7 μm). As can be seen in the graphical representation 581 of FIG. 5B, a relatively greater portion of light may be usable with the light reflecting back down off of the mirror as compared to FIG. 5A.

It can be seen from a comparison of the simulations of FIGS. 5A and 5B that including a top mirror in a passive section may significantly improve a coupling efficiency in the downward direction.

Figure 4:
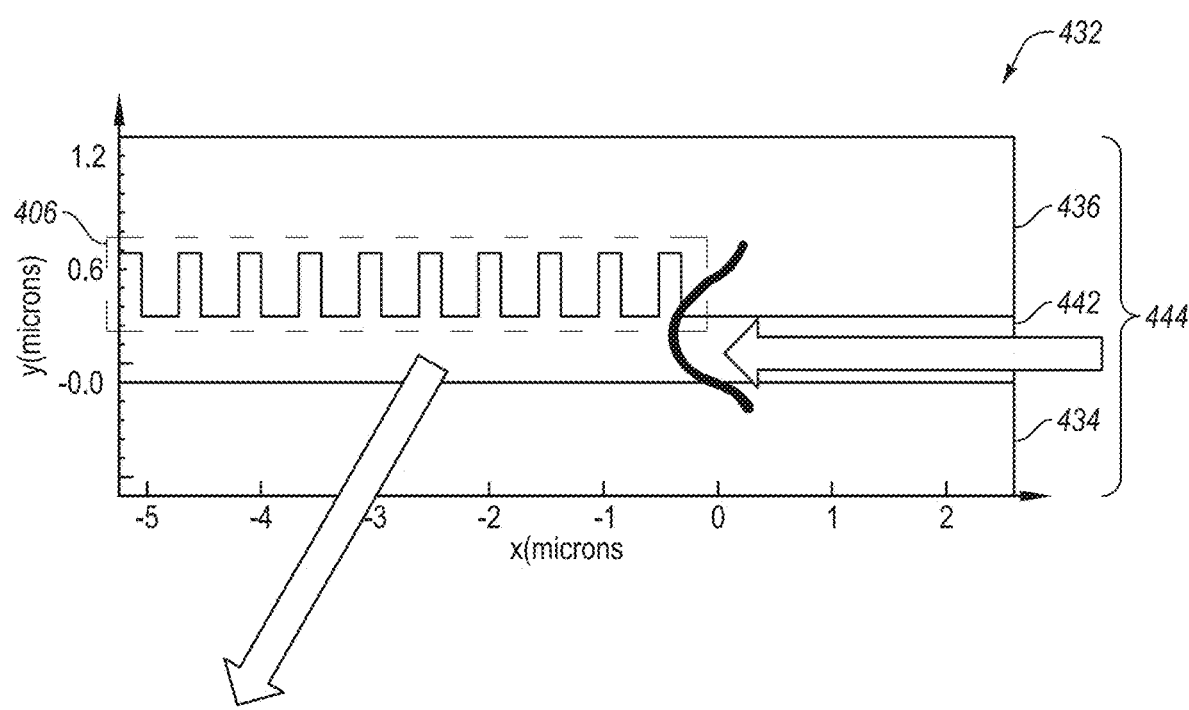
FIG. 4 illustrates a passive section of another example grating coupled laser.

FIG. 4 illustrates a passive section 432 of another example GCL laser, arranged in accordance with at least one embodiment described herein. The GCL laser that includes the passive section 432 may be implemented in one or more of the surface coupled systems discussed herein. The passive section 432 may include a waveguide core 442 optically coupled to a transmit grating coupler 406. The transmit grating coupler 406 may include or correspond to the other transmit grating couplers discussed herein. The passive section 432 may also include a substrate 434 as a bottom cladding beneath the waveguide core 442 and the transmit grating coupler 406, and a top cladding 436 above the waveguide core 442 and the transmit grating coupler 406. The top cladding 436, the waveguide core 442, and the bottom cladding 434 together may form a waveguide 444. In this example, light beams may propagate through the waveguide 444 in a right to left direction. The light beams may travel in the waveguide 444 until the light beam is diffracted in the direction of the bottom cladding 434 by the transmit grating coupler 406. Some or all of the diffracted light beam may propagate through and out of the bottom cladding 434.

In some embodiments, the bottom cladding 434 may include InP with a bottom cladding index of refraction of about 3.2. Alternatively or additionally, the top cladding 436 may include a dielectric such as SiO$_2$ with a top cladding index of refraction of about 1.46, or more generally a dielectric with a top cladding index of refraction in a range from 1-2. Alternatively or additionally, the waveguide core 442 may include InGaAsP (sometimes referred to as In$_x$Ga$_{1-x}$As$_y$P$_{1-y}$ to denote the ratios of In, Ga, As, and P) with a core index of refraction that is higher than the bottom cladding index of refraction to guide an optical mode. Varying the variables x and y in the composition In$_x$Ga$_{1-x}$As$_y$P$_{1-y}$ varies the material bandgap and hence refractive index and loss.

A wide range of refractive indices for the waveguide core 442 may lead to a guided mode in the waveguide 444. However, in order to achieve high diffraction efficiency of light that is propagated into the far field and can reach a receive grating coupler in a Si PIC, suitable refractive indices for the waveguide core 442 may be more limited. In more detail, since the transmit grating coupler 406 may include repeated periodic regions of InGaAsP (or other material) that may have a first index of refraction and periodic regions of SiO$_2$ (or other material) with a second index of refraction, where the first index of refraction is higher than the second index of refraction, a resulting effective index of the transmit grating coupler 406 may be reduced relative to the waveguide core 442. As a result, if the effective index of the transmit grating coupler 406 becomes similar to or less than an index of refraction for a bottom cladding 434 (e.g., a refractive index of an InP substrate), then light beams diffracting from the transmit grating coupler 406 may be leaked into substrate modes and may not diffract into the far field in the desired direction and out of the bottom cladding 434 (e.g., an InP substrate) to reach a receive grating coupler in a Si PIC which is some working distance away.

FIG. 6A illustrates a graphical representation 683 of an example of a far field profile as a function of diffraction angle for a passive section, such as the passive section 432 discussed in relation to FIG. 4 above, arranged in accordance with at least one embodiment described herein. The passive section may have a core index of refraction of 3.38. As illustrated in FIG. 6A, a large fraction of light may be directed into leaky modes 685 into the substrate and may not diffract into the far field. The passive section may have a reduced coupling efficiency for coupling light from a GCL laser to a Si PIC and may be impractical for a lot of industry uses.

According to at least one embodiment described herein, the core index of refraction may be at least 6% higher than the bottom cladding index of refraction to provide good efficiency such that the effective index of the resulting first diffraction grating is sufficiently higher than the bottom cladding index of refraction (e.g., of the InP substrate) to avoid leakage into the substrate.

Alternatively or additionally, a composition of InGaAsP for a waveguide core with an index of refraction of 3.40 or higher may generally avoid (or at least reduce compared to the simulation 683 of FIG. 6A) leakage into the substrate. However, as the index of refraction increases, it may lead to loss caused by material absorption, so a compromise may be made to, e.g., balance substrate leakage and loss.

Figure 6B:
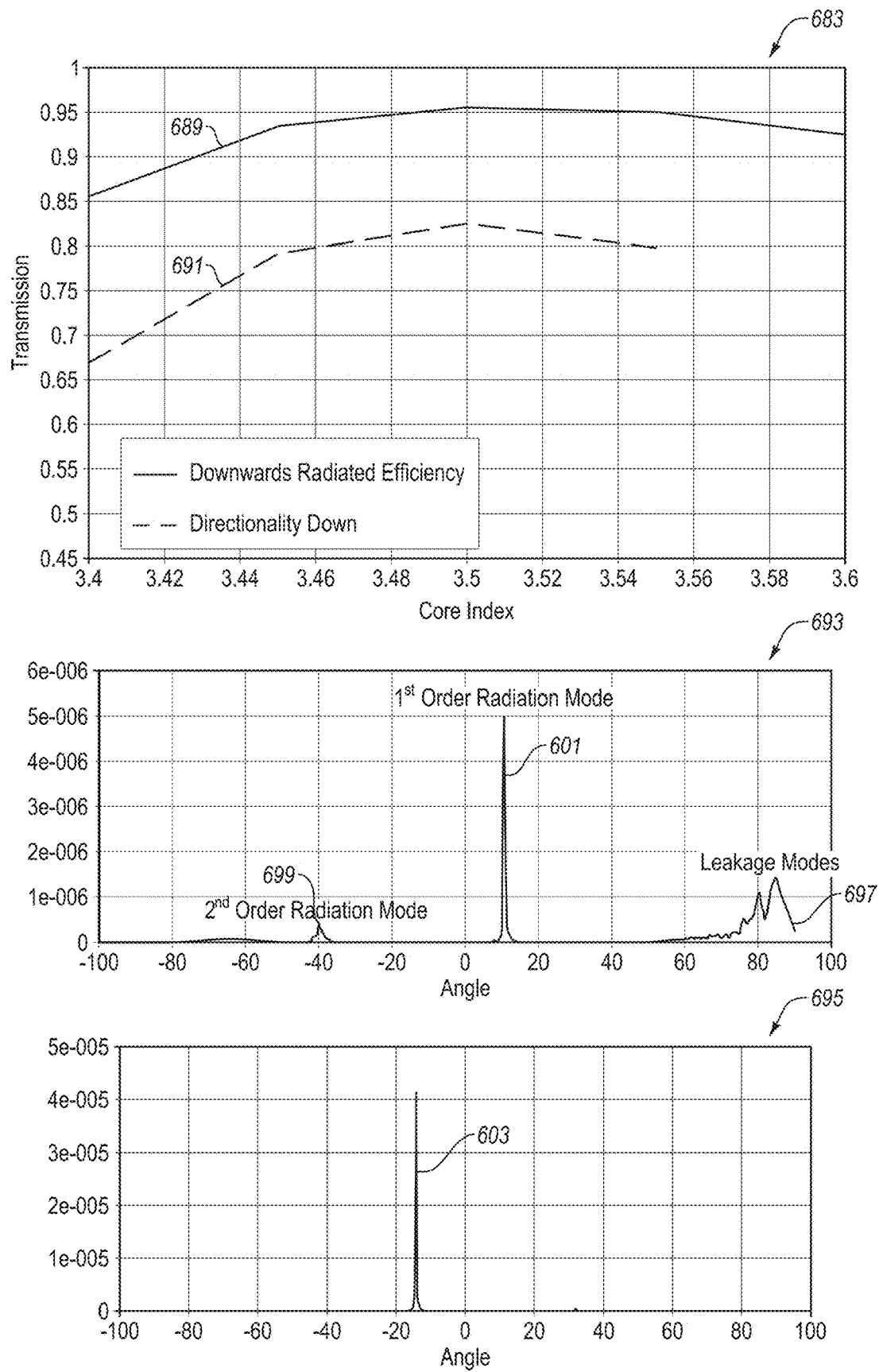
FIG. 6B illustrates various graphical representations of simulations for diffracted light from a passive section of a grating coupled laser.

FIG. 6B illustrates various graphical representations of simulations for diffracted light, arranged in accordance with at least one embodiment described herein. Graph 687 represents a simulation of diffracted power as a function of a waveguide core index of refraction for a transmit grating coupler such as the transmit grating coupler 406 of FIG. 4. Curve 689 represents total downward diffracted power as a function of the waveguide core index of refraction for the transmit grating coupler. Curve 689 accounts for useful diffracted light (e.g., light actually radiated out of the substrate into the far field) as well as light that has leaked into the substrate but does not exit the substrate. Curve 691 represents far field downward diffracted power as a function of the waveguide core index of refraction for the transmit grating coupler. Curve 691 may include only the useful diffracted light that is actually radiated out of the substrate into the far field.

Graph 693 and graph 695 include far field profiles as a function of diffraction angle for two different waveguide core indices of refraction. In the simulation represented in graph 693, the waveguide core may have an index of refraction of 3.38 and much of the light may be lost to leakage at higher diffraction angles (e.g., angles above about 70 degrees) as denoted at 697. As denoted at 699, the simulation in graph 693 includes a second order radiation mode where light may be lost at about a −40 degree diffraction angle. As denoted at 601, the simulation in graph 693 includes a first order radiation mode at a diffraction angle of about 10 degrees. In the simulation represented in graph 693, only about 20 percent of total power may be usable and included in the first order radiation mode. In comparison, in the simulation represented in graph 695, the waveguide core index of refraction may be 3.42 and there is a single radiation mode denoted at 603 at a diffraction angle of about −17 degrees.

The waveguide core index of refraction of an InGaAsP core material may be adjusted by changing the value(s) of x and/or y in the $In_xGa_{1-x}As_yP_{1-y}$ material composition (or other material composition) that makes up a waveguide core. Changing the value(s) of x and/or y changes the bandgap of $In_xGa_{1-x}As_yP_{1-y}$, which in turn changes its index of refraction. As index of refraction increases with changes in bandgap, diffraction efficiency decreases due to material absorption. Thus, even though an index of refraction of 3.5 may have a higher far field downward diffracted power than an index of refraction of 3.42, the index of refraction of 3.5 may have too much material absorption loss associated with it compared to the index of refraction of 3.42, leading to an overall lower diffraction efficiency. In one embodiment, a range between 3.4 and 3.44 for the index of refraction of the waveguide core 432 may strike a suitable balance between far field downward diffracted power and diffraction efficiency in some embodiments. In other embodiments, the index of refraction of the waveguide core may be less than 3.4 or greater than 3.44 depending on the particular implementation.

Figure 7:
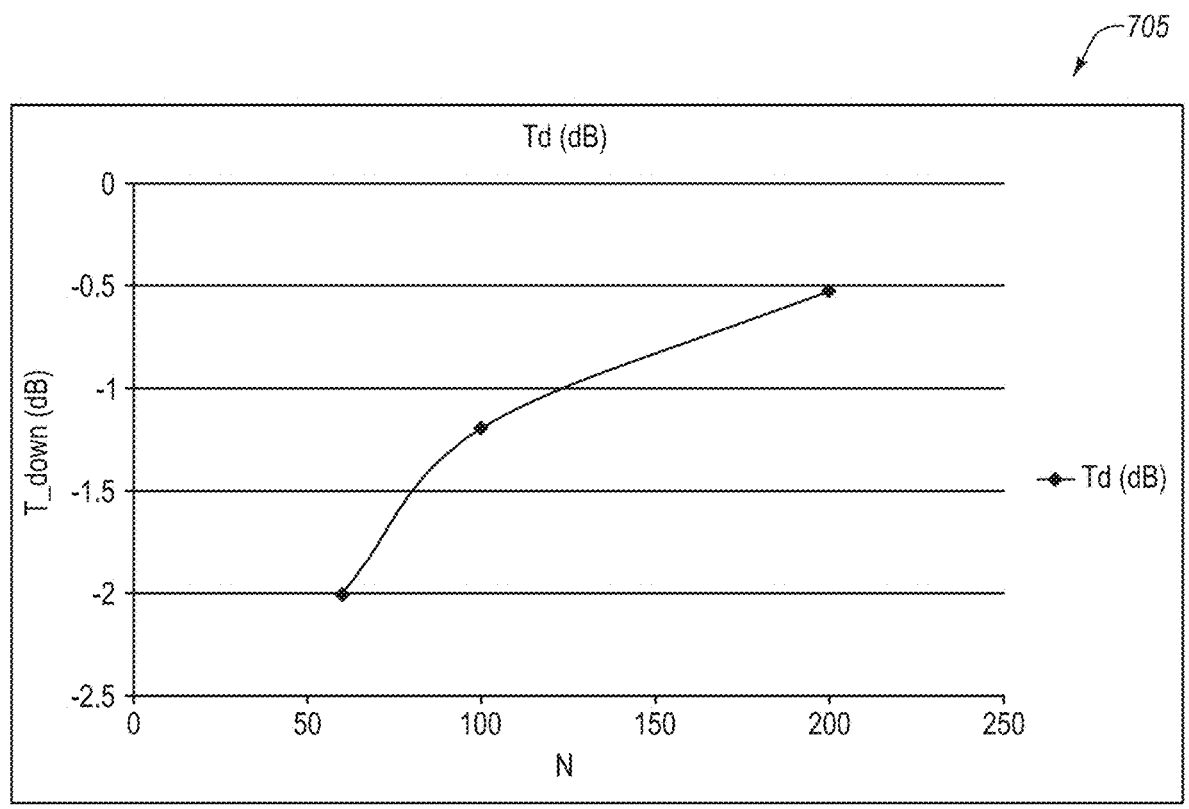
FIG. 7 illustrates a graphical representation of a simulation of diffraction efficiency loss as a function of number N of grating periods of a transmit grating coupler in a passive section of a grating coupled laser with a top mirror.

FIG. 7 illustrates a graphical representation 705 of a simulation of diffraction efficiency loss as a function of number N of grating periods of a transmit grating coupler in a passive section with a top mirror, such as the passive section 332 of FIG. 3, arranged in accordance with at least one embodiment described herein. In the simulation of FIG. 7, a diffraction efficiency loss of 0 dB may equal complete (i.e. one hundred percent) downward diffraction. As can be seen in the graphical representation 705 of FIG. 7, as the number N of grating periods increase, the diffraction efficiency increases.

Figure 8:
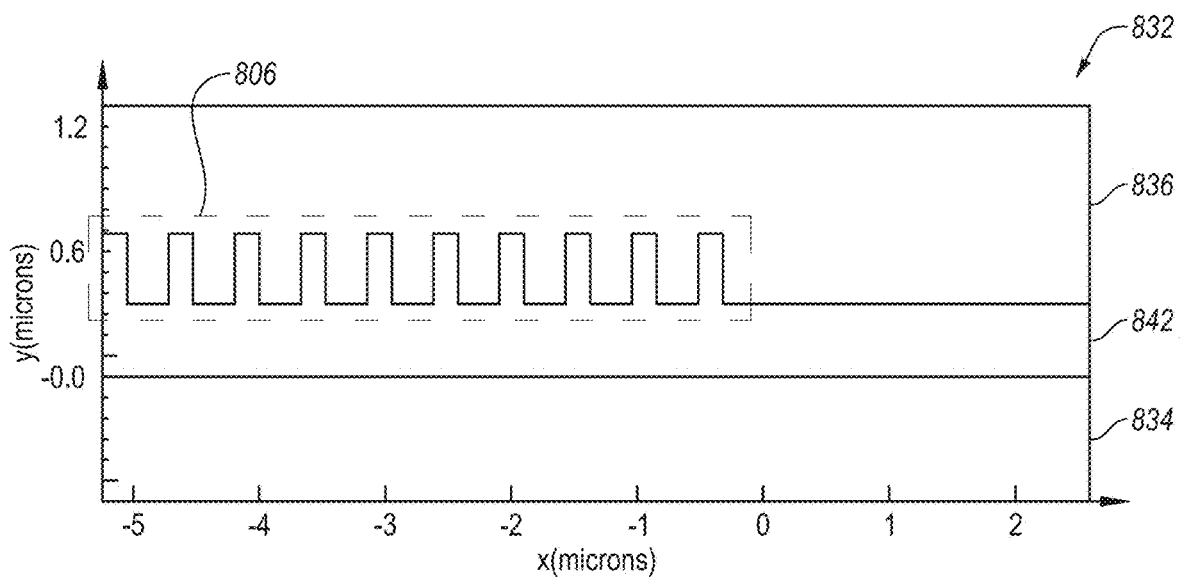
FIG. 8 illustrates another passive section of a grating coupled laser.

FIG. 8 illustrates another passive section 832 of a GCL laser, arranged in accordance with at least one embodiment described herein. The GCL laser that includes the passive section 832 of FIG. 8 may be implemented in one or more of the surface coupled systems discussed herein. The passive section 832 may include a top cladding 836 made of SiO2, SiNx, or other suitable cladding material, a waveguide core 842 and a transmit grating coupler 806. The transmit grating coupler 806 may include grating teeth (i.e., alternating material with different indexes of refraction). The transmit grating coupler 806 and waveguide core 842 may be made of InGaAsP. Additionally, the passive section 832 may include a bottom cladding 834 made of a substrate of InP. In at least one embodiment, the waveguide core 842 may have a height above the bottom cladding 834 of about 350 nm, such as 300-380 nm, 325-375 nm or 350 nm. Alternatively or additionally, the grating teeth of the transmit grating coupler 806 may have a total height measured from a bottom of the waveguide core 842 to a top of the grating teeth of the transmit grating coupler 806 of about 650 nm, such as 550-700 nm, 600-680 nm, 650-680 nm, or 673.9 nm. Alternatively or additionally, the grating teeth of the transmit grating coupler 806 may have a height above the waveguide core 842 measured from a top of the waveguide core 842 to the top of the grating teeth of the transmit grating coupler 806 of about 300 nm, such as 250-350 nm, 310-330 nm, or 323.9 nm.

As illustrated in FIG. 8, the grating teeth of the transmit grating coupler 806 alternate with cladding teeth of the top cladding 836 and may therefore have a grating period and/or duty cycle. The grating period may be 525.6 nm, meaning there may be a distance of 525.6 nm between a front of each grating tooth and the front of a subsequent grating tooth. More generally, the grating period may be in a range from 500 nm to 600 nm. In an example embodiment, the transmit grating coupler 806 may include 120 grating periods. The duty cycle of the transmit grating coupler 806 may be 0.397, meaning each grating tooth may span 39.7% of each grating period where a corresponding top cladding tooth occupies a remainder of each grating period. More generally, the duty cycle may be in a range from 0.3 to 0.5. In an example embodiment, the transmit grating coupler 806 or other transmit grating couplers described herein may include one or more of the following parameters: 120 grating periods, a grating period of 525.6 nm, a duty cycle of 0.397, a total grating tooth height of 673.9 nm, a downward radiation efficiency (DRE) of −0.454 dB, a radiated diffraction angle $\theta_{rad}$ of −14.24 degrees, a transmission through the transmit grating coupler of about 3.42%, and reflected power of about −53.6 dB. Here DRE is the useful portion of the light that is radiated out to the far field and is defined as the fraction of power radiated out of the diffraction grating towards the substrate in a small angular window about the radiated diffraction angle $\theta_{rad}$.

Figure 10:
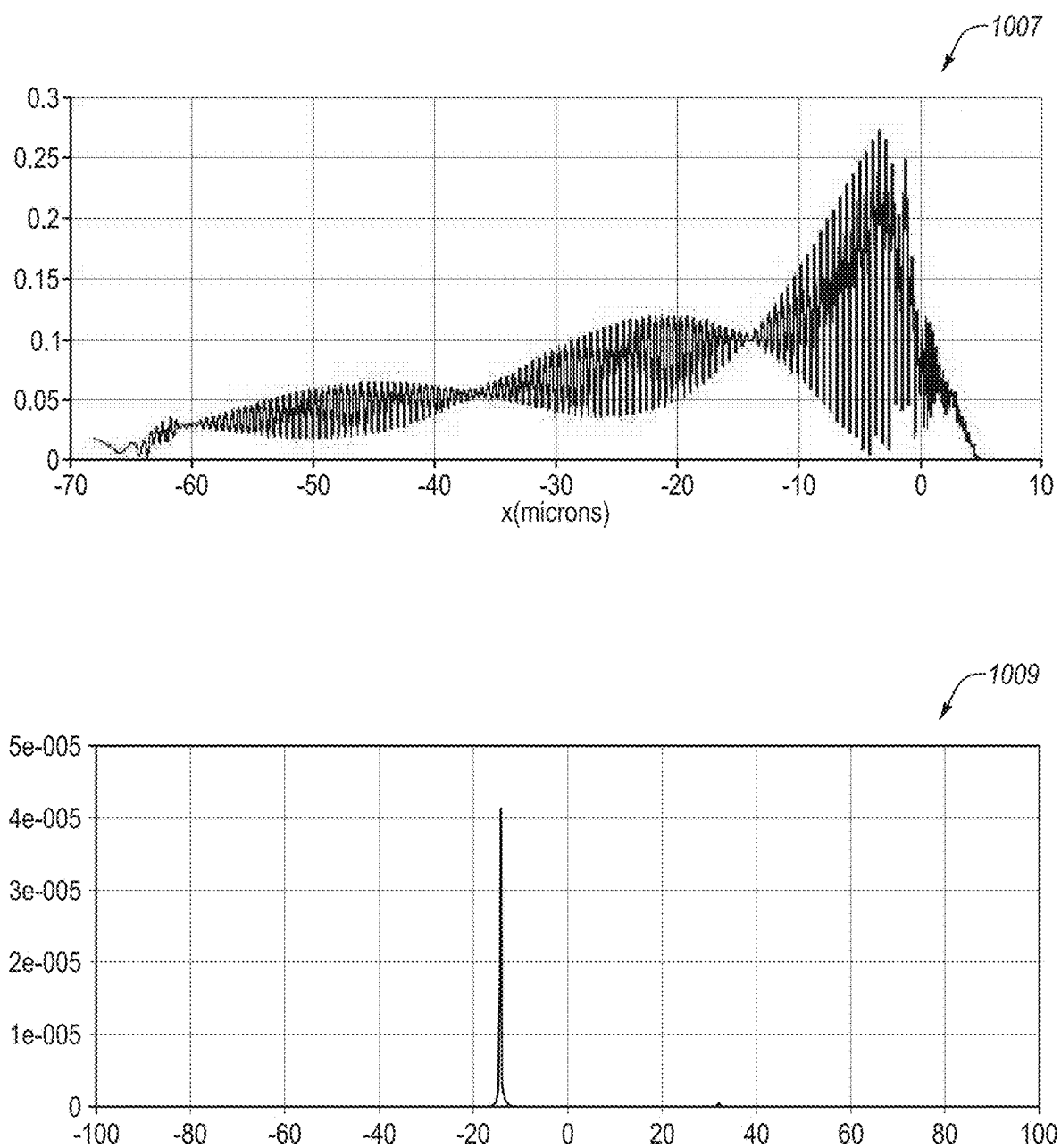
FIG. 10 illustrates various graphical representations of electric field of grating output as a function of location along a length of a transmit grating coupler and a far field profile as a function of diffraction angle of the transmit grating coupler.

FIG. 10 illustrates various graphical representations of the magnitude of electric field of grating output as a function of location along a length of a transmit grating coupler and a far field profile as a function of diffraction angle of the transmit grating coupler, arranged in accordance with at least one embodiment described herein. FIG. 10 includes simulations for a transmit grating coupler such as the transmit grating coupler 406 of FIG. 4 or the transmit grating coupler 806 of FIG. 8. In more detail, graph 1007 illustrates the magnitude of the electric field of grating output as a function of location along the length of the transmit grating coupler. Graph 1009 illustrates the far field profile as a function of diffraction angle of the transmit grating coupler.

In view of at least FIGS. 4, 6A, 6B, 8, and the associated description, the instant application recognizes various parameters discussed herein and associated with particular designs for the transmit grating coupler that can be included in GCL lasers of one or more surface coupled systems described herein. Embodiments described herein may include one or more of these parameters, which will be discussed in connection with FIG. 8 above. Although some of the parameters discussed above have been specific to InP-based transmit grating couplers, one or more of the following parameters may be applied to transmit grating couplers of other material compositions.

First, the total height of the grating teeth may be greater than the height of the waveguide core. Some diffraction gratings are formed by etching down into a waveguide core to form grating teeth such that the height of the waveguide core in areas that do not include the grating teeth is the same as or greater than the total height of the grating teeth. In comparison, according to some embodiments disclosed herein, the height of the waveguide core in areas that do not include the grating teeth is less than the total height of the grating teeth.

Second, the grating tooth index of refraction (e.g., the index of refraction of the grating teeth that extend upward from the waveguide core) may be greater than or equal to the core index of refraction (e.g., the index of refraction of the waveguide core). It may be easier to fabricate the grating teeth from the same material composition as the waveguide core, in which case the grating tooth index of refraction may be the same as the core index of refraction. In other embodiments, the grating teeth may be fabricated from a different material composition than the waveguide core if the grating tooth index of refraction is greater than or equal to the core index of refraction.

Third, an effective index of the first diffraction grating may be sufficiently higher than the bottom cladding index of refraction (e.g., the index of refraction of the bottom cladding/substrate) to avoid leakage of a diffracted optical mode into the substrate. For example, the effective index of the first diffraction grating, which depends on at least the core index of refraction and the top cladding index of refraction (e.g., the index of refraction of the top cladding) may be at least 6% higher than the bottom cladding index of refraction.

Figure 9:
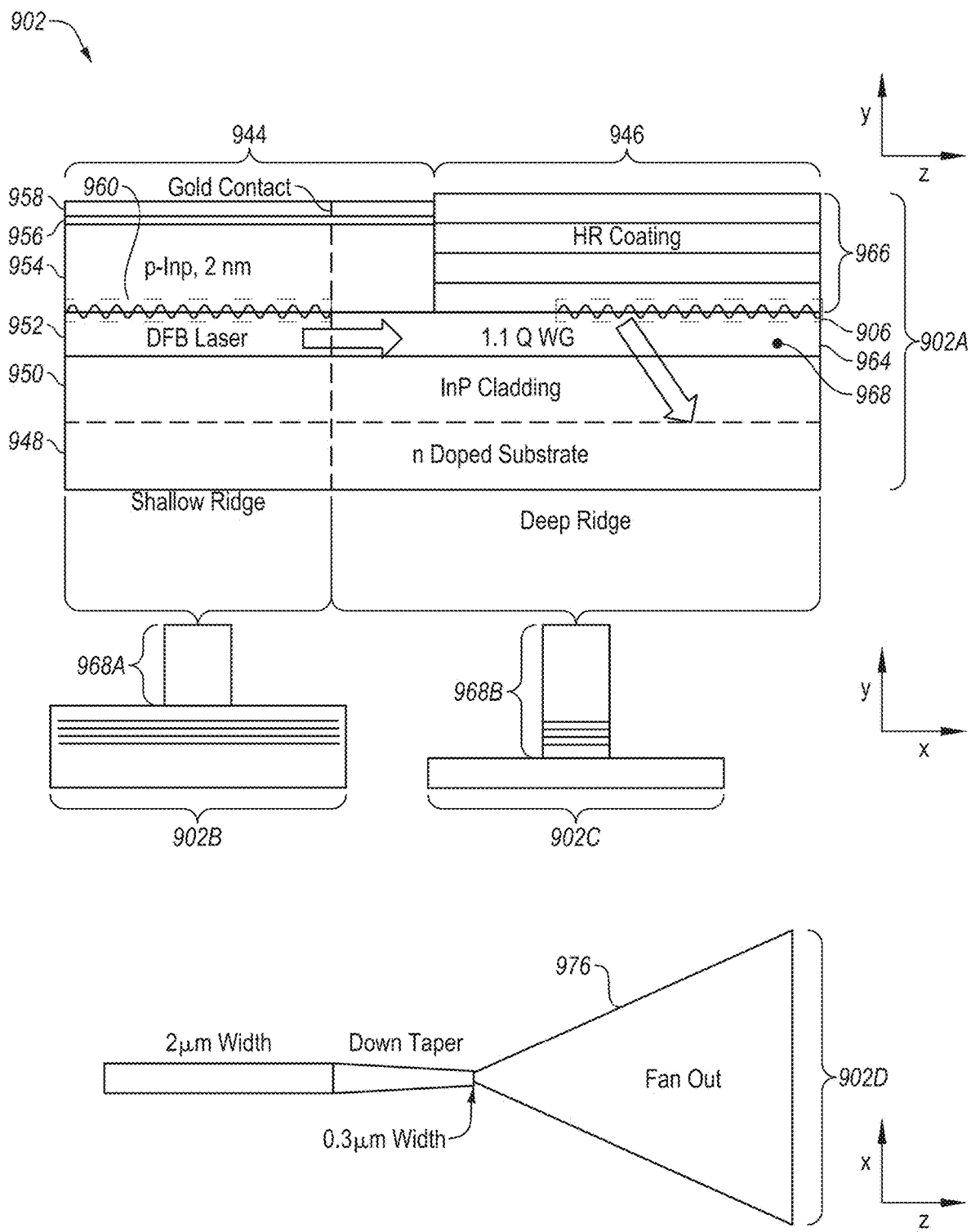
FIG. 9 illustrates a side cross-sectional view, a shallow ridge end-oriented cross-sectional view, a deep ridge end-oriented cross-sectional view, and an overhead view of another example grating coupled laser.

FIG. 9 illustrates a side cross-sectional view 902A, a shallow ridge end-oriented cross-sectional view 902B, a deep ridge end-oriented cross-sectional view 902C, and an overhead view 902D of another example GCL laser 902, arranged in accordance with at least one embodiment described herein. The GCL laser 902 may be implemented in one or more of the surface coupled systems described herein.

The GCL laser 902 may include an active section 944 with an active section ridge structure 968A and a passive section 946 with a passive section ridge structure 968B. The active section 944 may include, from bottom to top in the side-cross-sectional view 902A, a substrate 948 implemented as an n-doped substrate, an InP cladding 950, a gain layer 952 implemented as a multiple-quantum well (MQW) and core guiding that may form a DFB laser, a p-InP layer 954, an InGaAs or other contact layer 956, and a gold contact 958. The gain layer 952 within the active section 944 may include a MQW sandwiched between upper and lower waveguide layers, with a diffraction grating 960 formed on the upper waveguide layer.

The passive section 946 may include, from bottom to top in the side-cross-sectional view, the substrate 948, the InP cladding 950, a core waveguide material layer 964, a transmit grating coupler 906, and a top mirror 966 or other HR coating. The core waveguide material layer 964 includes a core waveguide 968 coupled end to end with the gain layer 952, a fan out region 976 (see overhead view 902D) coupled end to end with the core waveguide 968, and a transmit grating coupler 906 formed at the interface between the core waveguide material layer 964 and the top mirror 966. In some embodiments the transmit grating coupler 906 may be coupled end to end with the fan out region 976. In some embodiments the transmit grating coupler 906 may partially overlap the fan out region 976. In some embodiments the transmit grating coupler 906 may completely overlap the fan out region 976. The top mirror 966 may include multiple dielectric layers of alternating indexes of refraction, a gold top mirror or other suitable top mirror or HR coating.

The active section ridge structure 968A of the GCL laser 902 may extend through the active section 944. The passive section ridge structure 968B may extend through the passive section 946. In some embodiments, the active and passive section ridge structures 968A-B may each have a width of 2 μm. As illustrated in the two end-oriented cross-sectional views 902B-C the active and passive section ridge structures 968A-B may have different ridge heights. In some embodiments, the active section ridge structure 968A may be a shallow ridge with a shorter ridge height than the passive section ridge structure 968B which may be a deep ridge. The active section ridge structure 968A may extend down to a depth that is above a depth of the gain layer 952 or to another one of the layers of the GCL laser 902. The passive section ridge structure 968B may extend down to a depth that is below a depth of the gain layer 952 or to another one of the layers of the GCL laser 902.

The relatively greater ridge height of the passive section ridge structure 968B may increase mode confinement. The increased mode confinement may increase diffraction of output light by the transmit grating coupler 906 and provide a large area mode in a lateral direction. As described above, the fan out region 976 and/or the transmit grating coupler 906 may be intended to expand the mode to 8-40 μm or 20-40 μm. The expansion of the mode to 8-40 μm or 20-40 μm may be achieved by forming the transmit grating coupler 906 as a weak (e.g., small index contrast), long grating in the z direction, where the z direction is the light propagation direction. Strong confinement in x and y by virtue of the passive section ridge structure 968B may increase diffraction and expand the mode in the x direction. The x direction refers to the lateral direction (e.g., orthogonal to z and left to right in the views 902B-C) and the y direction refers to the vertical direction (e.g., orthogonal to x and z).

Thus, as described with respect to FIG. 9, GCL lasers may be implemented as ridge waveguide lasers. In other embodiments, GCL lasers as described herein may be implemented as buried hetero-structure (BH) lasers. Whether implemented as a ridge waveguide laser or a BH laser, some embodiments of the GCL lasers described herein may include the transmit grating coupler "bolted" onto the GCL laser to couple light generated by the GCL laser out through an upper or lower surface of the GCL laser.

Figure 11:
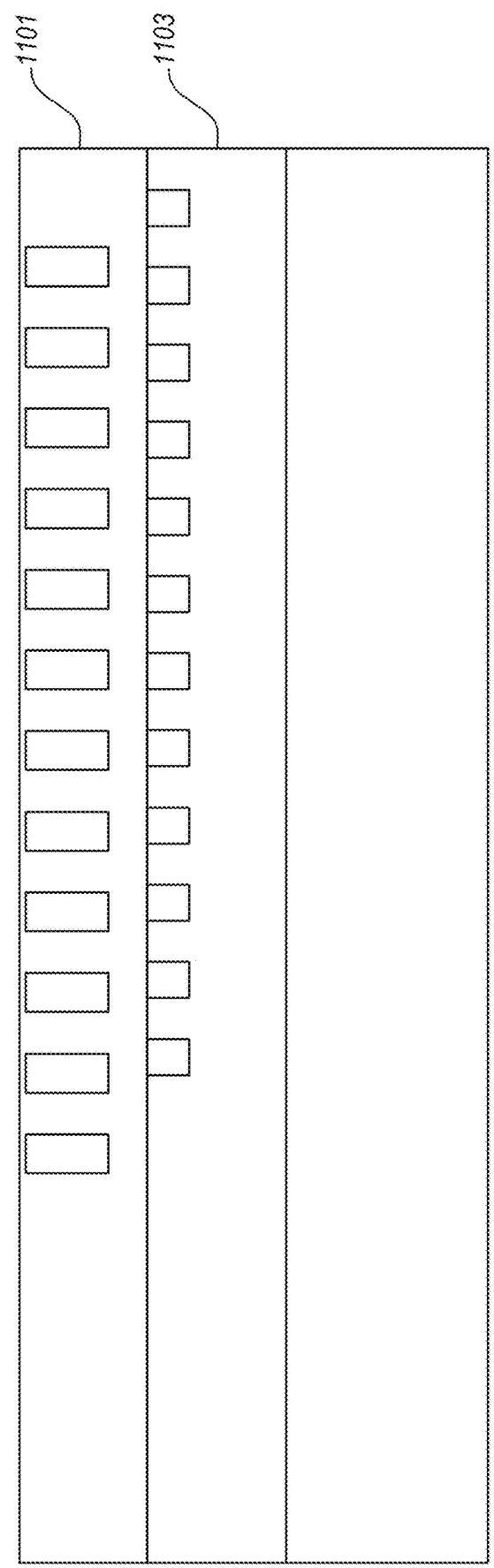
FIG. 11 depicts an example concept to increase directionality of a surface grating that may be implemented in one or both of the transmit and receive grating couplers described herein.

FIG. 11 depicts an example concept to increase directionality of a grating coupler that may be implemented in one or both of the transmit and receive grating couplers described herein, arranged in accordance with at least one embodiment described herein. In the example of FIG. 11, one grating 1101 may be formed over another grating 1103. One of the gratings 1101 or 1103 may be shifted relative to the other. The two stacked gratings 110, 1103 may be implemented together as one of the transmit grating couplers to diffract light out of a laser or as one of the receive grating couplers to diffract light into a Si PIC as described herein.

Figure 12A:
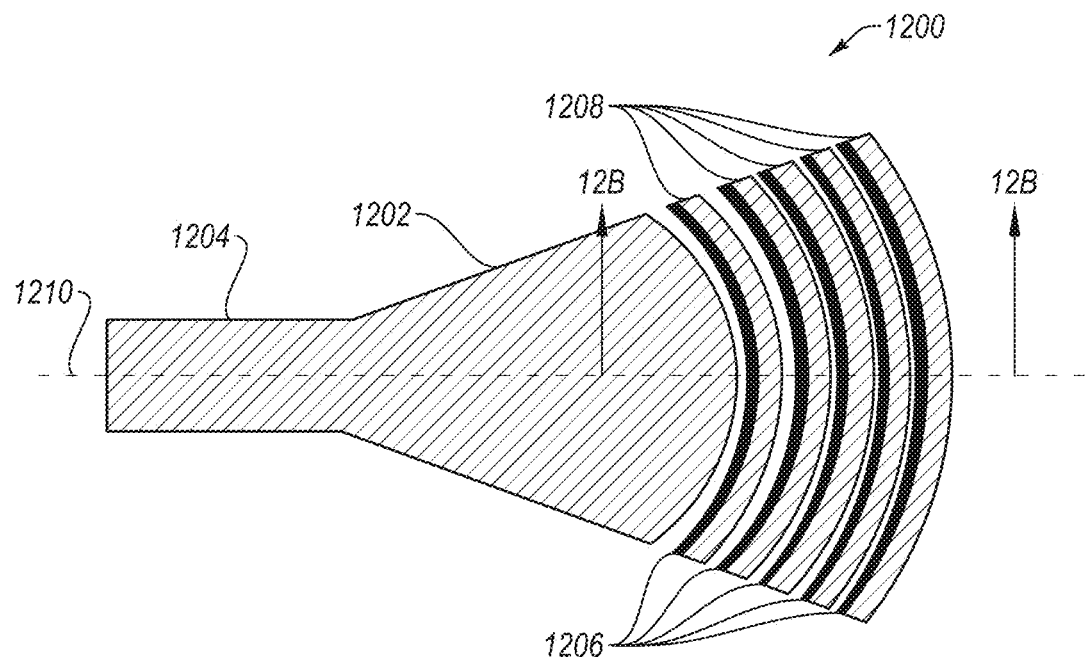
FIGS. 12A and 12B illustrate an example receive grating coupler implemented as a dual layer grating coupler.
Figure 12B:
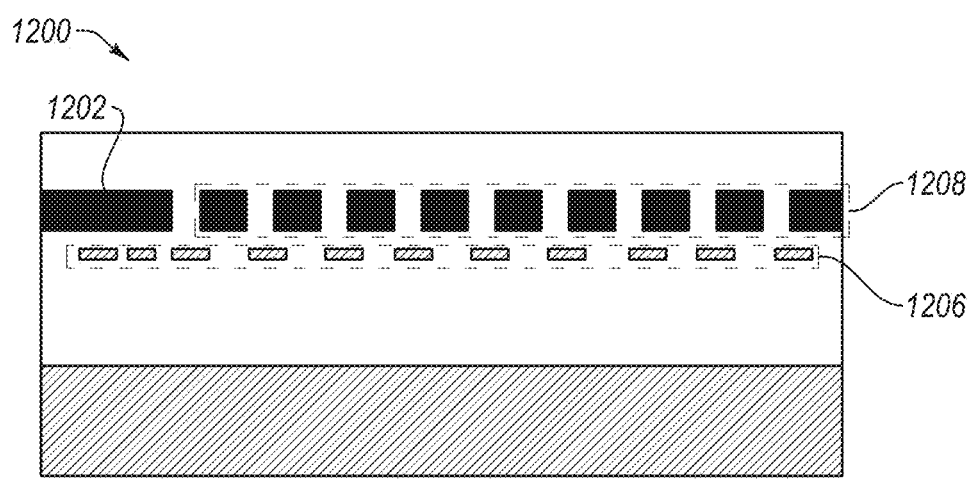

FIGS. 12A and 12B illustrate an example receive grating coupler 1200 implemented as a dual layer grating coupler, arranged in accordance with at least one embodiment described herein. FIG. 12A is an overhead view and FIG. 12B is a cross-sectional side view along cutting plane 12B-12B in FIG. 12A. The receive grating coupler 1200 may include or correspond to other receive grating couplers described herein.

As illustrated in FIG. 12A, the receive grating coupler 1200 may be formed, at least in part, in an inverse fan out region 1202 of a Si PIC. The inverse fan out region 1202 may be optically coupled to a waveguide core 1204 of the Si PIC. The waveguide core 1204 may be surrounded by cladding on one or more sides to form a waveguide. The waveguide that includes the waveguide core 1204 may be optically coupled to receive light from the inverse fan out region 1202, which light may be coupled into the waveguide by the receive grating coupler 1200. The inverse fan out region 1202 may be formed from a same medium and layer as the waveguide core 1204 such that the inverse fan out region 1202 may generally be an extension of the waveguide core 1204. The inverse fan out region 1202 may be surrounded by cladding on one or more sides to form an inverse fan out waveguide. Some or all of the inverse fan out region 1202 may include grating lines, as illustrated in FIG. 12A, such that the inverse fan out region 1202 may generally be an extension of the receive grating coupler 1200.

The receive grating coupler 1200 may be optically coupled to a transmit grating coupler of a GCL laser light (or to an optical fiber or other light source) to receive light from the transmit grating coupler (or from the optical fiber or other light source). The receive grating coupler 1200 may couple the light into the inverse fan out region 1202. Within the inverse fan out region 1202, a mode of the light may be decreased laterally (e.g., generally up and down in FIG. 12A or in and out of the page in FIG. 12B). The light with the decreased mode may then be transmitted elsewhere in the Si PIC in which the receive grating coupler 1200, the inverse fan out region 1202, and the waveguide core 1204 are formed through the waveguide that includes the waveguide core 1204.

As illustrated in FIGS. 12A and 12B, the receive grating coupler 1200 may include a dual layer grating that includes both a first grating 1206 and a second grating 1208. The second grating 1208 may be spaced apart from and above the first grating 1206 within the Si PIC.

The receive grating coupler 1200 may have any suitable optical mode size and/or shape. For example, the optical mode size and/or shape of the receive grating coupler 1200 may match or substantially match the optical mode size and/or shape of a transmit grating coupler of a GCL laser from which the receive grating coupler 1200 receives light. A "substantial match" may include a match of 50% or better, 60% or better, 70% or better, 80% or better, or 90% or better. Two optical modes may match or substantially match if, e.g., one of the optical modes overlaps the other optical mode by at least 50%, at least 60%, at least 70%, at least 80%, at least 90%, or even 100%. As a specific example, the receive grating coupler 1200 may have an optical mode size of 30 micrometers, or more generally between 20-40 micrometers, and a Gaussian or substantially Gaussian mode.

One or both of the first and second gratings 1206, 1208 may include a uniform grating (e.g., a grating with uniform duty cycle and uniform grating period along a length of the grating). Some uniform gratings may have exponential modes.

Alternatively or additionally, one or both of the first and second gratings 1206, 1208 may include a non-uniform grating (e.g., a grating with non-uniform duty cycle and non-uniform grating period along the length of the grating). Some non-uniform gratings may have mode shapes other than exponential modes, and the non-uniformity may be configured to achieve a predetermined mode shape, e.g., through apodization. Accordingly, one or both of the first and second gratings 1206, 1208 may be apodized to impart a Gaussian or substantially Gaussian mode to the receive grating coupler 1200. In some embodiments, a coupling efficiency of the receive grating coupler may be 0.5 to 3 dB, such as 1 dB, for incident light from the GCL laser that has a Gaussian mode with an optical mode size between 20 to 40 micrometers, such as 30 micrometers.

Figure 13:
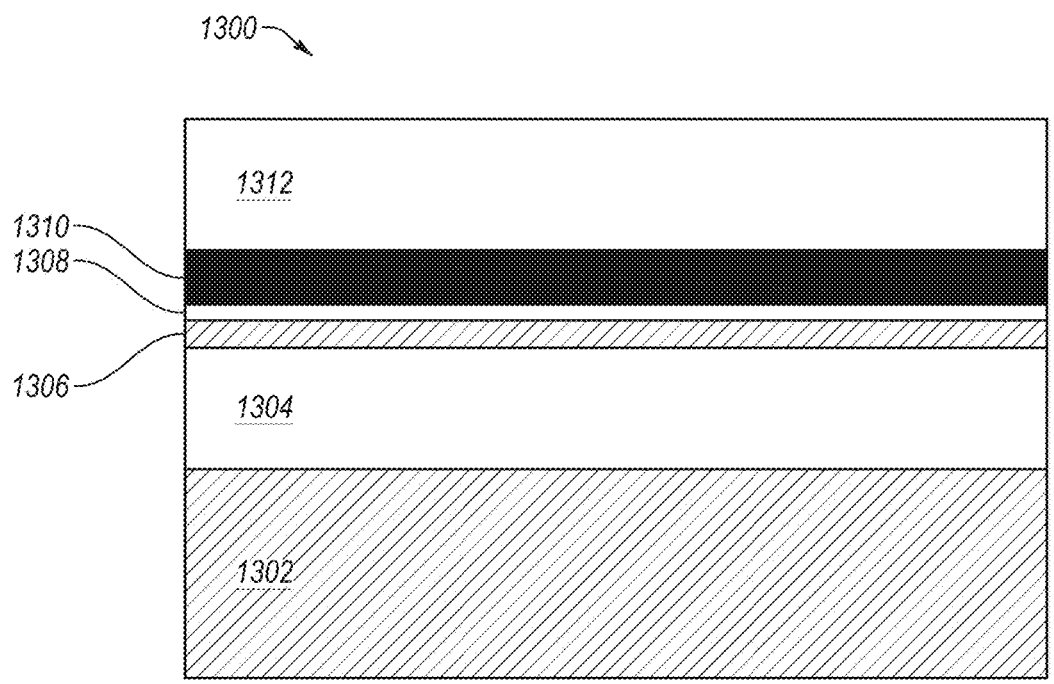
FIG. 13 is a side view of an example material stackup of the receive grating coupler of FIGS. 12A and 12B.

FIG. 13 is a side view of an example material stackup 1300 of the receive grating coupler 1200 of FIGS. 12A and 12B, arranged in accordance with at least one embodiment described herein. As illustrated in FIG. 13, the material stackup 1300 may include a substrate 1302, a buried oxide (box) layer 1304 formed above and/or on the substrate 1302, a first layer 1306 formed above and/or on the box layer 1304, an oxide layer 1308 formed above and/or on the first layer 1306, a second layer 1310 formed above and/or on the oxide layer 1308, and a top cladding 1312 formed above and/or on the second layer 1310.

The substrate 1302 may include a Si substrate or other suitable substrate.

The box layer 1304 may include silicon-on-insulator (SOI) box layer, such as a silicon dioxide box layer.

The first layer 1306 may be a silicon layer. The first grating 1206 of FIGS. 12A and 12B may be formed in the first layer 1306, e.g., as a silicon grating. Within the first layer 1306, silicon (or other material) may alternate with silicon dioxide (or other material with a different index of refraction than silicon) to form the first grating 1206.

The oxide layer 1308 may include a gate oxide layer.

The second layer 1310 may be a silicon nitride layer. The second grating 1208 of FIGS. 12A and 12B may be formed in the second layer 1310, e.g., as a silicon nitride grating. Within the second layer 1310, silicon nitride (or other material) may alternate with silicon dioxide (or other material with a different index of refraction than silicon nitride) to form the second grating 1208. In some embodiments, the waveguide core 1204 may be formed in the second layer 1310. In other embodiments, the waveguide core 1204 may be formed in another layer of the material stackup 1300.

The top cladding 1312 may include silicon dioxide or other suitable cladding material.

Some receive grating couplers that include a single grating may be implemented in a thin Si SOI platform, e.g., with a silicon layer for a silicon grating and without a silicon nitride layer for a silicon nitride grating. In such thin Si SOI platforms, a thickness of the silicon layer may be about 160 nm such that the silicon grating may have poor directionality due to the relatively thin silicon layer. As such, it may be difficult to get high coupling efficiency using such a thin Si SOI platform that includes a single grating implemented as a silicon grating.

Accordingly, some embodiments described herein include a silicon nitride layer, e.g., the second layer 1310 of FIG. 13, which may result in a dual layer grating coupler, e.g., the receive grating coupler 1200 of FIGS. 12A and 12B or other suitable dual layer grating couplers, that may have high broadband coupling efficiency. Manufacturing of such a dual layer grating coupler may have high repeatability as a result of a relatively tightly controlled thickness of the oxide layer 1308 and/or other parameters of one or both of the first layer 1306 and the second layer 1310.

Table 1 includes example thickness ranges (e.g., up and down in FIG. 13) for some of the layers of the material stackup 1300 of FIG. 13, arranged in accordance with at least one embodiment described herein.

TABLE 1

| Layer | Example Thickness Range |
| --- | --- |
| second layer 1310 | 300 nanometers to 800 nanometers |
| oxide layer 1308 | 1 nanometer to 20 nanometers |
| first layer 1306 | 50 nanometers to 200 nanometers |
| box layer 1304 | 1 micrometer to 3 micrometers |

Table 2 includes simulated coupling efficiency (CE) and 1 dB bandwidth (1 dB BW) for three different example dual layer receive grating couplers (receive grating coupler 1, receive grating coupler 2, receive grating coupler 3) each at a center wavelength of 1310 nanometers, arranged in accordance with at least one embodiment described herein. Each of the three dual layer receive grating couplers may include or correspond to the receive grating coupler 1200 of FIGS. 12A and 12B and/or may have the same or similar material stackup as the material stackup 1300 of FIG. 13.

TABLE 2

| Grating | Input angle | CE | 1 dB BW | Grating type |
| --- | --- | --- | --- | --- |
| Receive grating coupler 1 | −32 | 1.05 | 12 nanometers | Negative angle |
| Receive grating coupler 2 | −9.75 | 1.81 | 49 nanometers | Negative angle |
| Receive grating coupler 3 | 8 | 2.45 | 69 nanometers | Uniform positive angle |

Figure 14:
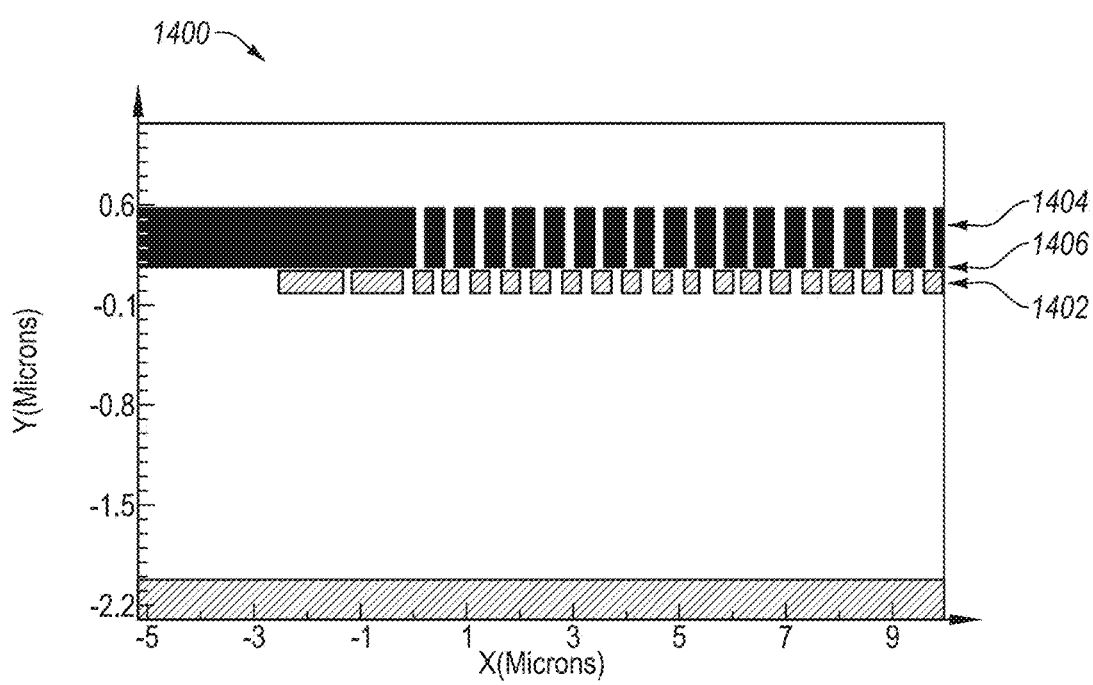
FIG. 14 illustrates another example receive grating coupler implemented as a dual layer grating coupler.

FIG. 14 illustrates another example receive grating coupler 1400 implemented as a dual layer grating coupler, arranged in accordance with at least one embodiment described herein. The receive grating coupler 1400 of FIG. 14 may include or correspond to one or more of the dual layer grating couplers described herein. FIG. 14 is a cross-sectional side view of the receive grating coupler 1400, which may have the same or similar material stackup as the material stackup 1300 of FIG. 13.

As illustrated in FIG. 14, the receive grating coupler 1400 may include both a first grating 1402 and a second grating 1404 spaced apart by a thin oxide layer 1406 (e.g., less than 20 nm). The second grating 1404 may be positioned above the first grating 1402 within a Si PIC that includes the receive grating coupler 1400. The first grating 1402 may include a Si grating and/or the second grating 1404 may include a SiN grating. A coordinate system is included in FIG. 14, each coordinate axis being in micrometers (or microns).

Figure 15:
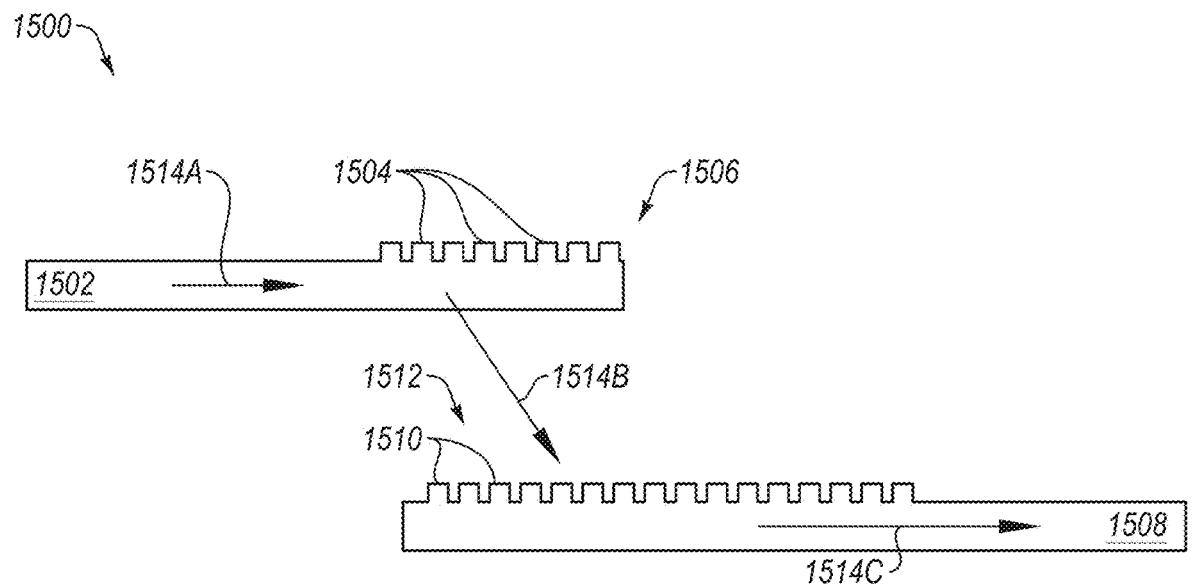
FIG. 15 illustrates portions of another example surface coupled system.
Figure 16:
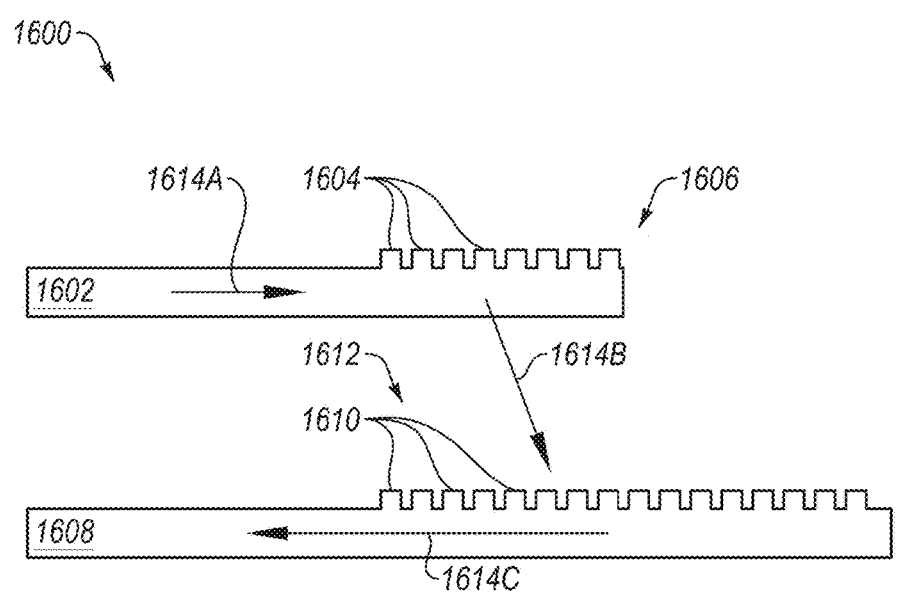
FIG. 16 illustrates portions of another example surface coupled system.

The transmit and receive grating couplers described herein may each include a positive angle grating coupler or a negative angle grating coupler, each of which is described in more detail with respect to FIG. 15 or FIG. 16.

FIG. 15 illustrates portions of another example surface coupled system 1500, arranged in accordance with at least one embodiment described herein. The surface coupled system 1500 of FIG. 15 includes a first waveguide core 1502 and transmit grating teeth 1504 (only some of which are labeled for simplicity) of a transmit grating coupler 1506 as well as a second waveguide core 1508 and receive grating teeth 1510 (only some of which are labeled for simplicity) of a receive grating coupler 1512. The transmit grating teeth 1504 are formed on the first waveguide core 1502 and may alternate with top cladding teeth (not shown in FIG. 15) of a top cladding (not shown in FIG. 15), which top cladding teeth may be formed or otherwise disposed in the gaps between the transmit grating teeth 1504. Similarly, the receive grating teeth 1510 are formed on the second waveguide core 1508 and may alternate with top cladding teeth (not shown in FIG. 15) of a top cladding (not shown in FIG. 15), which top cladding teeth may be formed or otherwise disposed in the gaps between the receive grating teeth 1510. In some embodiments, the top cladding and top cladding teeth for either or both of the transmit and receive grating couplers 1506, 1512 may include a dielectric, such as $SiO_2$, air, or other suitable material.

In the example of FIG. 15, the receive grating coupler 1512 is a positive angle grating coupler. FIG. 15 additionally illustrates light propagation directions 1514A, 1514B, and 1514C at various locations in the surface coupled system 1500. As used herein, a positive angle grating coupler is a surface grating coupler in which the light propagation direction 1514A, 1514C in the corresponding waveguide 1502, 1508 is in the same direction as a lateral component of the light propagation direction 1514B of light diffracted out of the grating coupler (in the case of the transmit grating coupler 1506) or of light incident on the grating coupler (in the case of the receive grating coupler 1512). For instance, in FIG. 15, light that is incident on the receive grating coupler 1512 travels in the light propagation direction 1514B that has a lateral component to the right and, after being coupled into the second waveguide 1508 in FIG. 15, the light travels in the light propagation direction 1514C that is also to the right.

FIG. 16 illustrates portions of another example surface coupled system 1600, arranged in accordance with at least one embodiment described herein. The surface coupled system 1600 of FIG. 16 is similar in many ways to the surface coupled system 1500 of FIG. 15. For instance, the surface coupled system 1600 of FIG. 16 similarly includes a first waveguide core 1602 and transmit grating teeth 1604 (only some of which are labeled for simplicity) of a transmit grating coupler 1606 as well as a second waveguide core 1608 and receive grating teeth 1610 (only some of which are labeled for simplicity) of a receive grating coupler 1612. The transmit grating teeth 1604 are formed on the first waveguide core 1602 and may alternate with top cladding teeth (not shown in FIG. 16) of a top cladding (not shown in FIG. 16), which top cladding teeth may be formed or otherwise disposed in the gaps between the transmit grating teeth 1604. Similarly, the receive grating teeth 1610 are formed on the second waveguide core 1608 and may alternate with top cladding teeth (not shown in FIG. 16) of a top cladding (not shown in FIG. 16), which top cladding teeth may be formed or otherwise disposed in the gaps between the receive grating teeth 1610. In some embodiments, the top cladding and top cladding teeth for either or both of the transmit and receive grating couplers 1606, 1612 may include a dielectric, such as $SiO_2$, air, or other suitable material.

In the example of FIG. 16, the receive grating coupler 1612 is a negative angle grating coupler. FIG. 16 additionally illustrates light propagation directions 1614A, 1614B, and 1614C at various locations in the surface coupled system 1600. As used herein, a negative angle grating coupler is a surface grating coupler in which light propagation in the corresponding waveguide is in the opposite direction as a lateral component of the propagation direction of the light diffracted out of the grating coupler (in the case of the transmit grating coupler 1606) or of incident light that is incident on the grating coupler (in the case of the receive grating coupler 1612). For instance, in FIG. 16, incident light that is incident on the receive grating coupler 1612 in the light propagation direction 1614B has a lateral component to the right and, after being coupled into the second waveguide that includes the second waveguide core 1608, the light propagates in the opposite direction, e.g., to the left, in the light propagation direction 1614C. In comparison, light propagating in the first waveguide that includes the first waveguide core 1602 propagates to the right according to the light propagation direction 1614A, which is in the same direction as the lateral component of the light propagation direction 1614B, such that transmit grating coupler 1606 is a positive angle grating coupler.

Some additional details regarding positive angle grating couplers and negative angle grating couplers are disclosed in U.S. patent application Ser. No. 15/977,907 filed on May 11, 2018, which application is incorporated herein by reference in its entirety.

Figure 17A:
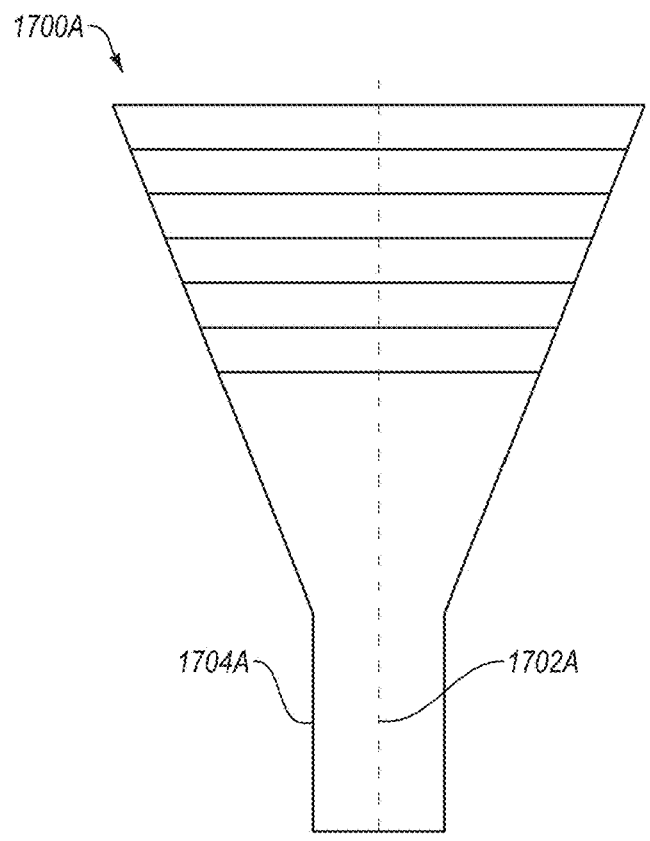
FIGS. 17A-17C illustrate three different example grating couplers that may be implemented as any of the grating couplers described herein, all arranged in accordance with at least one embodiment described herein.
Figure 17B:
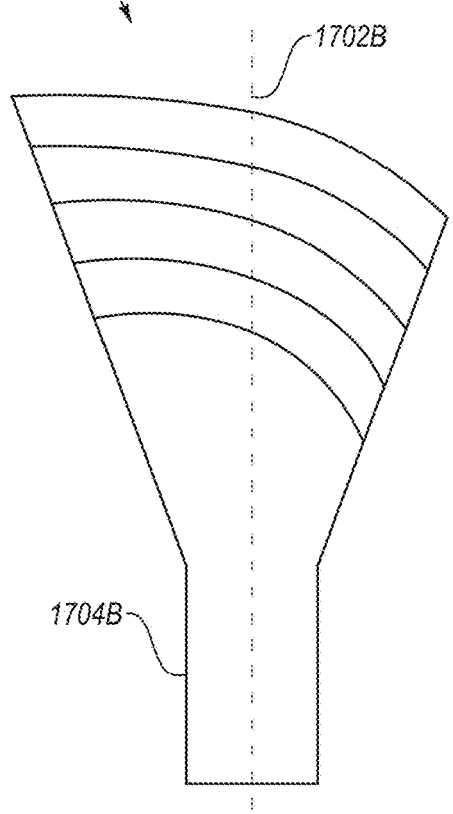
Figure 17C:
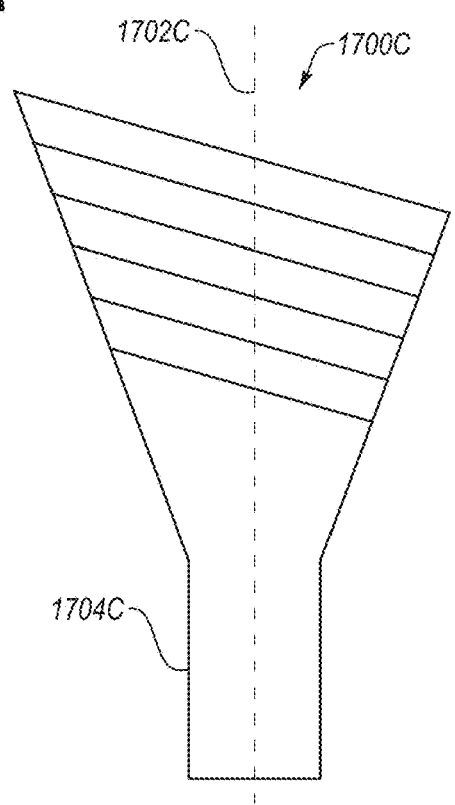

The transmit and receive grating couplers described herein and/or one or both gratings within a dual layer grating coupler may alternatively or additionally have grating lines that are straight, curved, angled, or not angled, as described in more detail with respect to FIGS. 12A and 17A-17C. FIGS. 17A-17C illustrate three different example grating couplers 1700A, 1700B, 1700C that may be implemented as any of the grating couplers described herein, arranged in accordance with at least one embodiment described herein.

The receive grating coupler 1200 of FIG. 12A (specifically, each of the first and second gratings 1206, 1208) and the grating coupler 1700B of FIG. 17B each has curved grating lines. In comparison, the grating coupler 1700A of FIG. 17A and the grating coupler 1700C of FIG. 17C each has straight grating lines.

Further, the grating lines of the grating coupler 1700B of FIG. 17B and the grating lines of the grating coupler 1700C of FIG. 17C are angled. In comparison, the grating lines of the receive grating coupler 1200 of FIG. 12A (specifically, the grating lines of each of the first and second gratings 1206, 1208) and the grating lines of the grating coupler 1700A of FIG. 17A are not angled.

Grating lines may be said to be not angled if a reference line, e.g., reference line 1210 in FIG. 12A or reference line 1702A in FIG. 17A, that is aligned to and extends from a center of the corresponding waveguide, e.g., waveguide core 1204 in FIG. 12A or waveguide core 1704A in FIG. 17A, is perpendicular to the grating lines. On the other hand, grating lines may be said to be angled if a reference line, e.g., reference line 1702B in FIG. 17B or reference line 1702C in FIG. 17C, that is aligned to and extends from a center of the corresponding waveguide, e.g., waveguide core 1704B in FIG. 17B or waveguide core 1704C in FIG. 17C, intersects the grating lines at a non-perpendicular angle.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
   a grating coupled laser comprising a first waveguide and a transmit grating coupler optically coupled to the first waveguide; and
   a photonic integrated circuit (PIC) comprising a second waveguide and a receive grating coupler optically coupled to the second waveguide,
   wherein:
   the receive grating coupler is in optical alignment with the transmit grating coupler;
   the receive grating coupler comprises a first grating and a second grating both in optical alignment together with the transmit grating coupler and both optically coupled to the second waveguide, the second grating being spaced apart from and above the first grating within the PIC; and
   the first and second gratings are each formed in respective first and second layers of the PIC.

2. The system of claim 1, wherein an optical mode size of the receive grating coupler is between 20 to 40 micrometers.

3. The system of claim 2, wherein a coupling efficiency of the receive grating coupler is 0.5 to 3 decibels (dB) for incident light from the grating coupled laser that has a Gaussian mode with an optical mode size between 20 to 40 mirometers.

4. The system of claim 1, wherein:
   the first grating of the receive grating coupler comprises a silicon grating; and
   the second grating of the receive grating coupler comprises a silicon nitride grating.

5. The system of claim 1, wherein the second grating is spaced apart from the first grating by an intermediate layer of oxide disposed between the first and second layers.

6. The system of claim 1, wherein at least one of:
   the receive grating coupler comprises a positive angle grating coupler;
   one or both of the first and second gratings of the receive grating coupler comprises grating lines that are straight and are spaced across the respective first and second layer; and the second waveguide of the PIC is arranged at a perpendicular angle to the grating lines of one or both of the first and second gratings.

7. The system of claim 1, wherein at least one of:
the receive grating coupler comprises a negative angle grating coupler;
one or both of the first and second gratings of the receive grating coupler comprises grating lines that are curved and are spaced across the respective first and second layer; and
the second waveguide of the PIC is arranged at a non-perpendicular angle to the grating lines of one or both of the first and second gratings.

8. The system of claim 1, wherein the system is devoid of an optical isolator between the grating coupled laser and the PIC.

9. The system of claim 1, wherein the PIC comprises:
a silicon substrate;
a silicon dioxide box layer formed above the silicon substrate;
a silicon layer formed above the silicon dioxide box layer and being the first layer in which the first grating is formed, the first grating comprising a silicon grating;
a gate oxide layer formed above the silicon layer and separating the first layer from the second layer;
a silicon nitride layer formed above the gate oxide layer and being the second layer in which the second grating is formed, the second grating comprising a silicon nitride grating, wherein the second waveguide is formed in the silicon nitride layer.

10. The system of claim 1, wherein:
the transmit grating coupler comprises grating teeth formed on the first waveguide, the grating teeth extending upward from a top of a core of the first waveguide, the grating teeth each having a total height and a height above the top of the core of the first waveguide; and
a core index of refraction of the core of the first waveguide is greater than a first threshold value so that an effective index of the transmit grating coupler is sufficiently higher than a bottom cladding index of refraction of a bottom cladding of the transmit grating coupler to avoid leakage of a diffracted optical mode into a substrate of the transmit grating coupler.

11. The system of claim 1, wherein:
the grating coupled laser further comprises an active section optically coupled to the first waveguide, a passive section that includes the first waveguide and the transmit grating coupler, and a ridge structure formed in the active section and the passive section; and
the ridge structure comprises a shallow ridge that extends downward to a first depth in the active section that is above a depth of a multiple quantum well layer of the active section and a deep ridge that extends downward to a second depth in the passive section that is below the depth of the multiple quantum well layer.

12. A system comprising:
a grating coupled laser comprising an active section and a passive section, the active section including a laser cavity, the passive section including a first waveguide and a transmit grating coupler, the first waveguide optically coupled end to end with the laser cavity; and
a photonic integrated circuit (PIC) comprising a second waveguide and a receive grating coupler optically coupled to the second waveguide, wherein:
the receive grating coupler is in optical alignment with the transmit grating coupler; and the receive grating coupler comprises a first grating formed in a first layer of the PIC, a second grating formed in a second layer of the PIC, and a gate oxide layer formed between the first layer and the second layer of the PIC,
the first and second gratings both in optical alignment together with the transmit grating coupler and both optically coupled to the second waveguide.

13. The system of claim 12, wherein:
an optical mode size of the receive grating coupler is between 20 to 40 micrometers; and at least one of the first grating or the second grating of the receive grating coupler is apodized such that an optical mode of the receive grating coupler overlaps an optical mode of light received from the grating coupled laser by at least 50%.

14. The system of claim 12, wherein:
the first grating of the receive grating coupler comprises a silicon grating; and
the second grating of the receive grating coupler comprises a silicon nitride grating.

15. The system of claim 12, wherein at least one of:
the receive grating coupler comprises a positive angle grating coupler;
one or both of the first and second gratings of the receive grating coupler comprises grating lines that are straight; and
the second waveguide of the PIC is arranged at a perpendicular angle to the grating lines of one or both of the first and second gratings.

16. The system of claim 12, wherein at least one of:
the receive grating coupler comprises a negative angle grating coupler;
one or both of the first and second gratings of the receive grating coupler comprises grating lines that are curved; and
the second waveguide of the PIC is arranged at a non-perpendicular angle to the grating lines of one or both of the first and second gratings.

17. The system of claim 12, wherein the system is devoid of an optical isolator between the grating coupled laser and the PIC.

18. The system of claim 12, wherein the PIC comprises:
a silicon substrate;
a silicon dioxide box layer formed above the silicon substrate;
the first layer comprising a silicon layer formed above the silicon dioxide box layer and in which the first grating is formed, the first grating comprising a silicon grating;
the gate oxide layer formed above the silicon layer; and
the second layer comprising a silicon nitride layer formed above the gate oxide layer and in which the second grating is formed, the second grating comprising a silicon nitride grating, wherein the second waveguide is formed in the silicon nitride layer.

19. The system of claim 12, wherein:
the transmit grating coupler comprises grating teeth formed on the first waveguide, the grating teeth extending upward from a top of a core of the first waveguide, the grating teeth each having a total height and a height above the top of the core of the first waveguide; and
a core index of refraction of the core of the first waveguide is greater than a first threshold value so that an effective index of the transmit grating coupler is sufficiently higher than a bottom cladding index of refraction of a bottom cladding of the transmit grating coupler to avoid leakage of a diffracted optical mode into a substrate of the transmit grating coupler.

20. A system comprising:

a grating coupled laser comprising an active section and a passive section, the active section including a laser cavity, the passive section including a first waveguide and a transmit grating coupler, the first waveguide optically coupled end to end with the laser cavity; and a photonic integrated circuit (PIC) comprising:

a silicon substrate;

a silicon dioxide box layer formed above the silicon substrate;

a silicon layer formed above the silicon dioxide box layer and in which a silicon grating is formed;

a gate oxide layer formed above the silicon layer; and a silicon nitride layer formed above the gate oxide layer and in which a silicon nitride grating is formed and in which a second waveguide is formed that is optically coupled to the silicon grating and the silicon nitride grating, wherein the silicon grating and the silicon nitride grating form a receive grating coupler, the silicon grating and the silicon nitride grating both being in optical alignment together with the transmit grating coupler and both being, optically coupled to the second waveguide, the receive grating coupler positioned to couple light received from the transmit grating coupler into the second waveguide.

* * * * *